(12) United States Patent
Risbo et al.

(10) Patent No.: US 7,002,406 B2
(45) Date of Patent: Feb. 21, 2006

(54) LOOP FILTER FOR CLASS D AMPLIFIERS

(75) Inventors: Lars Risbo, Copenhagen (DK); Claus N. Neesgaard, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 25 days.

(21) Appl. No.: 10/846,281

(22) Filed: May 14, 2004

(65) Prior Publication Data

US 2005/0017799 A1    Jan. 27, 2005

Related U.S. Application Data

(60) Provisional application No. 60/471,498, filed on May 16, 2003.

(51) Int. Cl.
*H03F 3/38* (2006.01)
(52) U.S. Cl. .................................. 330/10; 330/251
(58) Field of Classification Search ................ 330/10, 330/251, 207 A; 375/238
See application file for complete search history.

(56) References Cited

U.S. PATENT DOCUMENTS 5,805,020 A * 9/1998 Danz et al. .................. 330/10
6,016,075 A * 1/2000 Hamo ........................... 330/10
6,232,833 B1 * 5/2001 Pullen ........................... 330/10

FOREIGN PATENT DOCUMENTS

WO    WO 98/19391    5/1998

OTHER PUBLICATIONS

Berkhout "Integrated Class D Amplifier", presented at the 112th Conventional of the Audio Engineering Society (May 10-13, 2002; Munich).

* cited by examiner

*Primary Examiner*—Henry Choe
(74) *Attorney, Agent, or Firm*—W. Daniel Swayze, Jr.; W. James Brady; Frederick J. Telecky, Jr.

(57) ABSTRACT

A class-D amplifier circuit (30; 30') providing improved open-loop error for base-band frequencies, such as the audio band, is disclosed. The amplifier circuit (30; 30') includes a comparator (35) for generating a pulse-width-modulated output signal that is applied to an output power stage (37). An LC filter (32) is at the output of the power stage (37). The amplifier circuit (30; 30') includes a loop filter having multiple feedback loop paths, with at least one feedback loop path coupled to the output of the power stage (37), and optionally, at least one feedback loop path coupled to the output of the LC filter (32). The transfer function ($H_{mae}(s)$) of the loop filter has a real part that has a much steeper slope (on the order of 80 dB/decade) at frequencies above the pulse-width-modulation switching frequency than the slope of its magnitude characteristic at frequencies below this switching frequency.

24 Claims, 20 Drawing Sheets

LOOP FILTER FOR CLASS D AMPLIFIERS

CROSS-REFERENCE TO RELATED APPLICATIONS

This application claims priority, under 35 U.S.C. §119(e), of U.S. Provisional Application No. 60/471,498, filed May 16, 2003.

STATEMENT REGARDING FEDERALLY SPONSORED RESEARCH OR DEVELOPMENT

Not applicable.

BACKGROUND OF THE INVENTION

This invention is in the field of audio amplifiers, and is more specifically directed to pulse-width modulated class D audio power amplifiers.

As is fundamental in the art, electronic amplifier circuits are often classified in various "classes". For example, the output drive transistors of class A amplifier circuits conduct DC current even with no audio signal, and the entire output voltage swing is of a single polarity. A class B amplifier, on the other hand, typically includes complementary output drive transistors, driving an output voltage swing including both positive and negative polarity excursions. Class B amplifiers are necessarily more efficient, because both complementary output drive transistors are never on at the same time. Class AB amplifiers maintain a small bias current through complementary output drive transistors, so that the output voltage swing is centered slightly above (or below) ground voltage. While the non-zero bias current renders class AB amplifiers theoretically less efficient than class B amplifiers, class AB amplifiers avoid the crossover distortion of class B amplifiers.

In recent years, digital signal processing techniques have become prevalent in many electronic systems. The fidelity provided by digital techniques has increased dramatically with the switching speed of digital circuits. In audio applications, the switching rates of modem digital signal processing are sufficiently fast that digital techniques have become accepted for audio electronic applications, even by many of the fussiest "audiophiles".

Digital techniques for audio signal processing now extend to the driving of the audio output amplifiers. A new class of amplifier circuits has now become popular in many audio applications, namely "class D" amplifiers. Class D amplifiers drive a complementary output signal that is digital in nature, with the output voltage swinging fully from "rail-to-rail" at a duty cycle that varies with the audio information. Complementary metal-oxide-semiconductor (CMOS) output drive transistors are thus suitable for class D amplifiers, as such devices are capable of high, full-rail, switching rates such as desired for digital applications. As known in the art, CMOS drivers conduct extremely low DC current, and their resulting efficiency is especially beneficial in portable and automotive audio applications, and also small form factor systems such as flat-panel LCD or plasma televisions. In addition, the ability to realize the audio output amplifier in CMOS enables integration of an audio output amplifier with other circuitry in the audio system, further improving efficiency and also reducing manufacturing cost of the system. This integration also provides performance benefits resulting from close device matching between the output devices and the upstream circuits, and from reduced signal attenuation.

In addition to audio amplifiers, class D amplifiers are also now used in other applications. Modern switching power supplies utilize class D power amplifier techniques. Class D amplifiers are also used in some motor control applications, such as voice coil motors for positioning the read/write heads in modem computer disk drives.

By way of background, FIG. 1 illustrates a basic conventional natural sampling pulse width modulator 1, in an open-loop mode, as used to generate a pulse width modulated (PWM) output signal. As shown in FIG. 1, conventional pulse width modulator 1 includes comparator 5, which compares an input signal x(t) at its positive input with a unity amplitude triangle wave, generated by signal source 3 and appearing at its negative input, to produce a two-level PWM output signal p(t). The triangle waveform is at a period T and a switching frequency $F_{sw}$, as shown. In this example, output signal p(t) is at an amplitude of +1 responsive to input signal x(t) being instantaneously higher than the current state of the triangle waveform, and at an amplitude of −1 responsive to input signal x(t) instantaneously being lower than the current state of the triangle waveform. In this unity gain example, if input signal x(t) is at a DC level k, the mean value of PWM output signal p(t) over time is also at a level k.

In this conventional natural sampling PWM modulator 1 for AC input signals x(t) at an input frequency $F_{in}$, the modulation is theoretically perfectly linear, in the sense that no harmonic distortion is produced by comparator 5. However, non-harmonic components are produced, at side bands defined by the signal input frequency $F_{in}$, corresponding to multiples of the switching carrier frequency $F_{sw}$:

$$N \cdot F_{sw} \pm M \cdot F_{in} \qquad (1)$$

These non-harmonic components are minimized if the switching (i.e., carrier) frequency $F_{sw}$ is significantly higher than the input frequency of interest $F_{in}$. In audio applications, this situation is typically present.

In practice, however, non-idealities in the observed electrical performance of conventional natural sampling PWM modulator 1 indicate deviations from theoretical behavior, especially from the downstream switching power stage that is controlled by PWM output signal p(t). For example, noise and distortion arises from switching delays in the downstream power stage that vary non-linearly with load current. In the modulator itself, errors such as amplitude distortion and noise in the triangle wave signal will be evident as distortion and noise in the PWM output signal p(t). Comparator 5 may itself also contribute to distortion and noise. In addition, noise, ripple, and variations in the power supply voltage biasing the downstream switching stage will also introduce errors in the ultimate output.

According to conventional approaches, feedback control compensates for many of these non-ideal effects. FIG. 2 illustrates a conventional arrangement for a feedback-controlled PWM modulator 1. In FIG. 2, output power stage 7 is shown, as receiving PWM output signal p(t) and driving the ultimate output signal y(t) for driving audio speakers or the like. In this example, input signal x(t) to modulator 1 is derived from ultimate input signal i(t) combined with a feedback signal from output signal y(t). Output signal y(t) is subtracted from input signal i(t) by the operation of inverter 9 and adder 11. The difference signal from adder 11 is applied to loop filter 13, which produces modulator input signal x(t) after application of transfer function H(s). Transfer function H(s) determines both the stability of the system, and the extent to which error is suppressed by the feedback loop.

The system of FIG. 2 can be analyzed by considering it as a linear system with an additional input d(t) that represents the system error from all causes. This model is illustrated in FIG. 3, in which modulator 1 and power stage 7 are represented by linear gain stage 17. Adder 15 applies modeled error input d(t) to the output of gain stage 17. In the case of FIG. 2, in which the triangle wave amplitude and the power supply voltage are both unity, gain K is also unity (assuming a constant power supply voltage). One can characterize the error transfer function ETF(s) as follows:

$$ETF(s) = \frac{1}{1 + K \cdot H(s)} \quad (2)$$

where K is the gain applied by gain stage 17. This error transfer function ETF(s) is the transfer function of error signal d(t) as it affects output signal p(t). The stability of the overall system can be determined from the poles of error transfer function ETF(s), and as such this stability depends on the gain K (which depends upon the power supply voltage) and on the transfer function H(s) of loop filter 13. Error suppression can be maximized by maximizing the gain of the loop filter 13 at the frequencies of interest; as evident from equation (2), the error suppression (i.e., the reciprocal of error transfer function ETF(s)) is effectively the loop filter gain itself, when this gain is sufficiently high.

The signal transfer function STF(s):

$$STF(s) = \frac{K \cdot H(s)}{1 + K \cdot H(s)} \quad (3)$$

is substantially at unity gain in the band of interest (i.e., the frequencies at which the gain of loop filter 13 is high).

For the sake of this discussion, the system can be normalized so that gain K is unity, for example by normalizing the transfer function H(s) of loop filter 13 with the gain of modulator 1 and power stage 7, and by including any scaling in the feedback path. In effect, all gains outside of loop filter 13 can be considered as moved into, and thus compensated by, transfer function H(s). As typical in the art, the description in this specification will assume such normalization for clarity of description, although it is to be understood that gain values outside of the loop could be at values other than unity if desired.

Another non-ideal factor that affects the fidelity of class D amplifiers is ripple in the output signal p(t). More specifically, stability is optimized by the switching frequency of the PWM output signal being equal to the switching frequency $F_{sw}$ of the triangular waveform. This characteristic is ensured by limiting the slew rate of the output of loop filter 13 to no more than the slew rate of the triangular waveform, which prevents the race-around condition in which the output of comparator 5 oscillates multiple times within a single period of the triangular waveform; this slew rate limitation holds true so long as waveform generator 3 in modulator 1 generates a substantially perfect triangle wave. These conditions also place an additional constraint on the transfer function H(s) of loop filter 13. It can readily be derived that ripple stability is attained by constraining the amplitude gain of transfer function H(s) at switching frequency $F_{sw}$:

$$|H(F_{sw})| \leq \frac{1}{\pi} \quad (4)$$

Conventional loop filters 13 typically have a slope of around 20 dB/decade at and just below the switching frequency, in order to ensure loop stability (i.e., placing closed loop poles in the left-hand plane). This constrains the unity gain frequency $F_{unity}$ to:

$$F_{unity} \leq \frac{F_{sw}}{\pi} \quad (5)$$

FIG. 4 illustrates a typical log-log response plot for a conventional loop filter in a natural sampling PWM modulator such as that in FIG. 2. At lower frequencies, the response slope is second-order, so that the error suppression carried out by the loop is maximized, while at higher frequencies, there are one or more zeros that reduces the slope to first order. In this regard, the unity gain frequency $F_{unity}$ is less than the switching frequency $F_{sw}$ ensuring ripple stability as described above. FIG. 4 also illustrates that the maximum loop gain (i.e., the error suppression) at frequency $F_{audio}$ (the upper limit of the audio band) is a function of the ratio of switching frequency $F_{sw}$ to audio frequency $F_{audio}$. In general, a loop filter may have a magnitude characteristic over frequency with slopes that are higher than second-order, provided that there are zeroes that reduce the slope to near first-order (6 dB/octave) around the unity gain frequency $F_{unity}$. These higher order loop filters will provide higher error suppression in the audio band.

Another concern faced by the designer of a PWM loop for audio amplification is the error due to aliasing in the feedback loop. As evident from this description, two PWM transitions occur in each switching period T, so that the sampling frequency is $2F_{sw}$. If the input signal x(t) has frequency components above the Nyquist frequency ($F_{sw}$), aliasing will be present in the output. More specifically, those components in input signal x(t) that are at frequencies near the switching frequency $F_{sw}$ will appear into the lower frequency audio band. This aliasing is, of course, undesirable for audio fidelity.

Referring back to FIG. 2, it is seen that high frequency components of the PWM output signal p(t) will feed back to the input of comparator 5. These high components are referred to as the ripple signal, which will produce an aliasing error when sampled by the comparator. In addition, because PWM output signal p(t) will have multiple side bands for each harmonic of switching frequency $F_{sw}$, these side bands will also alias down as harmonic distortion.

By way of further background, Berkhout, "Integrated Class D Amplifier", presented at the 112th Conventional of the Audio Engineering Society (May 10–13, 2002; Munich), describes a class D amplifier that includes a second-order loop filter 13. The transfer function H(s) for this conventional filter is a weighted sum of a first order integrator and a second order integrator:

$$H(s) = \frac{K_1}{s} + \frac{K_2}{s^2} = \frac{K_1 s + K_2}{s^2} \qquad (6)$$

The first order integrator is a typical loop filter transfer function for simple class D amplifiers, as it has a zero real part for all positive integer multiples of the switching frequency $F_{sw}$, and thus produces no aliasing DC error. As known in the art, the second order integrator increases the error suppression in the base-band. The summed first and second order terms in the Berkhout loop filter introduces a real zero at $s=-K_2/K_1$ that reduces the phase characteristic to 90° for loop stability. However, it has been observed that the error function of the loop will be effectively set by the second-order integrator, and the error will scale with $K_2$. The error suppression in the base-band also scales with $K_2$, in which case the closed loop error will effectively be constant, such that increasing the second-order feedback by scaling $K_2$ will be ineffective in decreasing distortion.

BRIEF SUMMARY OF THE INVENTION

It is therefore an object of this invention to provide a class D amplifier having a loop filter in which the aliasing error is minimized in the base-band frequencies of interest.

It is a further object of this invention to provide such a class D amplifier in which the stability of the loop filter is not decreased while reducing the aliasing error.

It is a further object of this invention to provide such a class D amplifier in which the amplitude characteristic has a sharper characteristic at low frequencies.

It is a further object of this invention to provide such an amplifier in which error inserted at the output LC filter is also included in the feedback loop.

It is a further object of this invention to provide such an amplifier in which the effects of load resistance are compensated by the loop filter.

It is a further object of this invention to provide such an amplifier in which these benefits are attained with minimum complexity in the feedback loop filter realization.

Other objects and advantages of this invention will be apparent to those of ordinary skill in the art having reference to the following specification together with its drawings.

The present invention may be implemented into a class D amplifier in which a feedback loop filter is provided. The loop filter includes at least one loop path with a transfer function of second order or higher, and at least one loop path in which the maximum negative slope of the magnitude versus frequency for frequencies below the switching frequency is lower than the negative slope of its real part at frequencies above the switching frequency. The loop filter can be realized as a single loop filter, in which the multiple loop paths operate from a feedback signal at the output of the power stage.

According to another aspect of the invention, the loop filter is implemented in a dual loop feedback arrangement, taking feedback signals on each side of an LC filter at the output of the class D amplifier. The LC filter characteristic not only filters the output signal of the amplifier, but also implements a second order loop path in the feedback loop filter that is summed with first order loop paths.

DETAILED DESCRIPTION OF THE INVENTION

The present invention will be described in connection with its preferred embodiment, namely as implemented into an audio amplifier, because it is contemplated that this invention is especially beneficial in such an application. However, it is also contemplated that the benefits of this invention can also be attained in other applications, such as switching power supplies, and motor control drivers such as used in disk drives. Accordingly, it is to be understood that the following description is provided by way of example only, and is not intended to limit the true scope of this invention as claimed.

Figure 1:
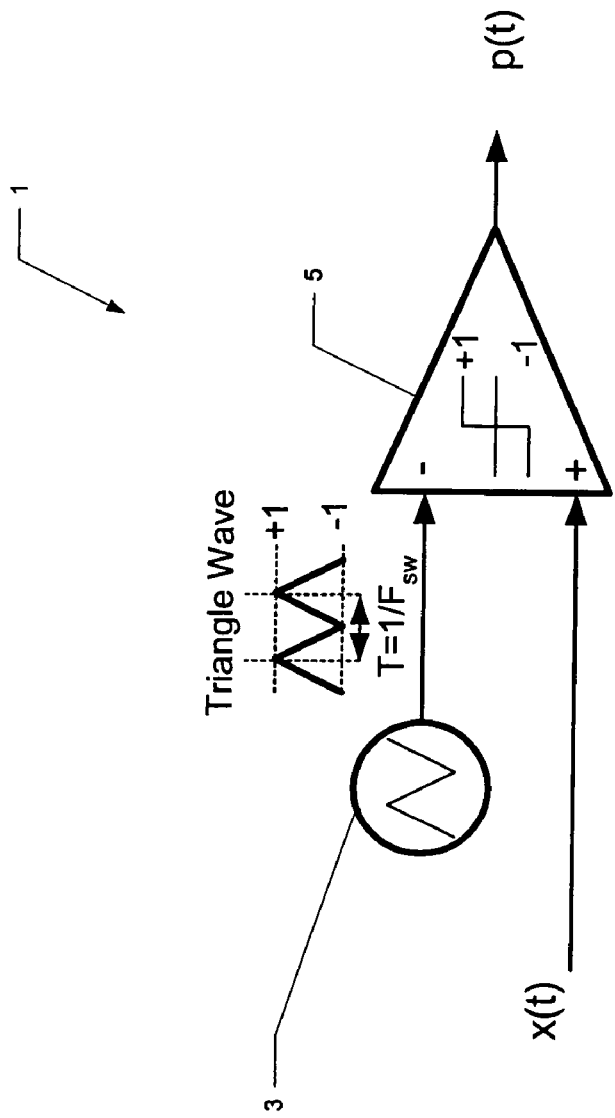
FIG. 1 is an electrical diagram, in block form, of a conventional pulse-width-modulator.
Figure 2:
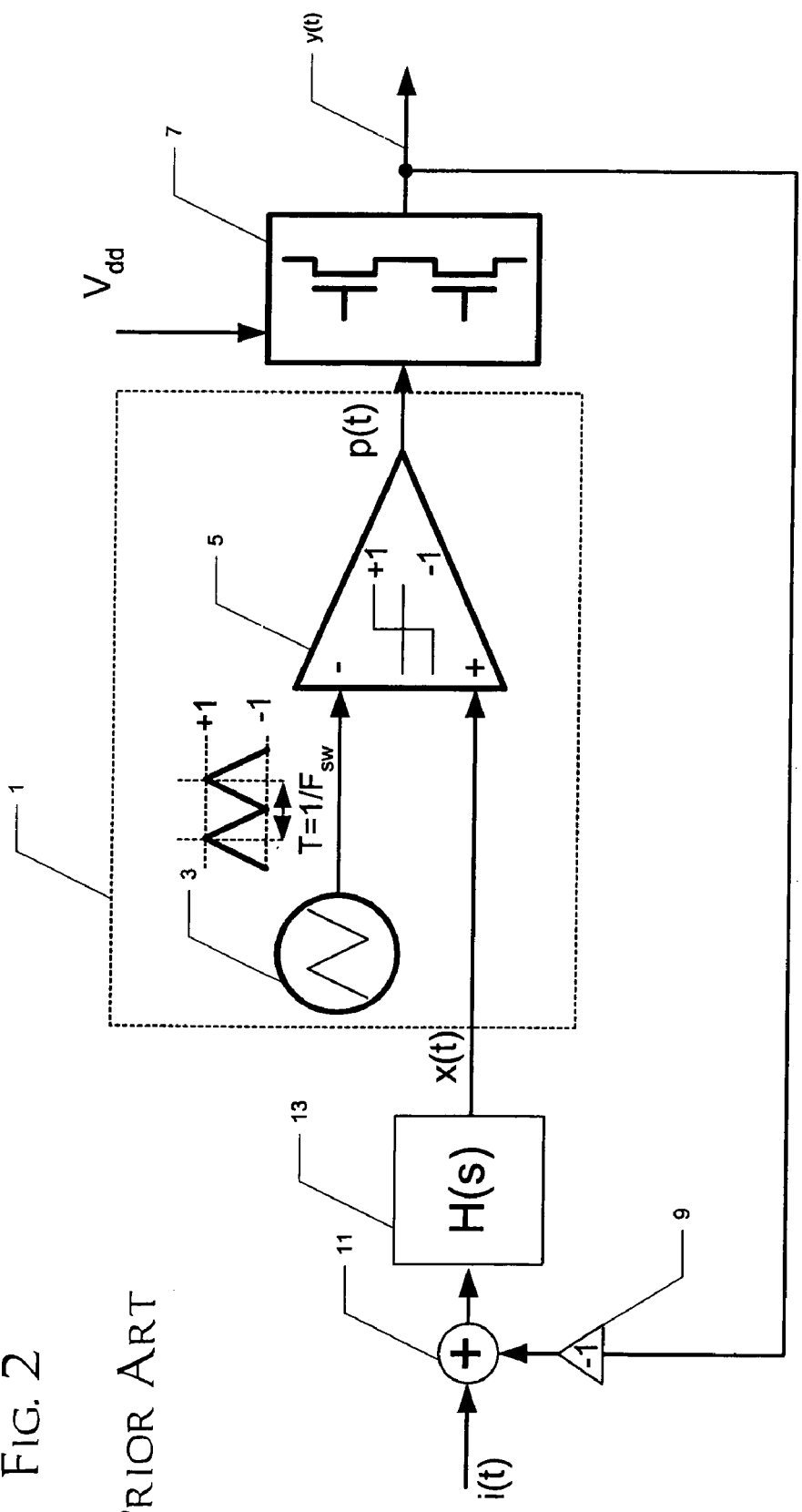
FIG. 2 is an electrical diagram, in block form, of a conventional class D amplifier incorporating a pulse-width-modulator driving an output stage, and a feedback loop filter.

The present invention is based on certain observations regarding the operation of loop filters in class D amplifiers, such as the conventional feedback-controlled class D amplifier of FIG. 2. As mentioned above, high frequency components of the output signal p(t) from conventional PWM modulators will feed back to the input of the comparator of the PWM modulator itself. These high frequency components are referred to as the ripple signal, r(t), which produces an aliasing error when sampled by the comparator. In addition, because PWM output signal p(t) will have multiple side bands for each harmonic of switching frequency $F_{sw}$, these side bands will also alias down as harmonic distortion.

Figure 5A:
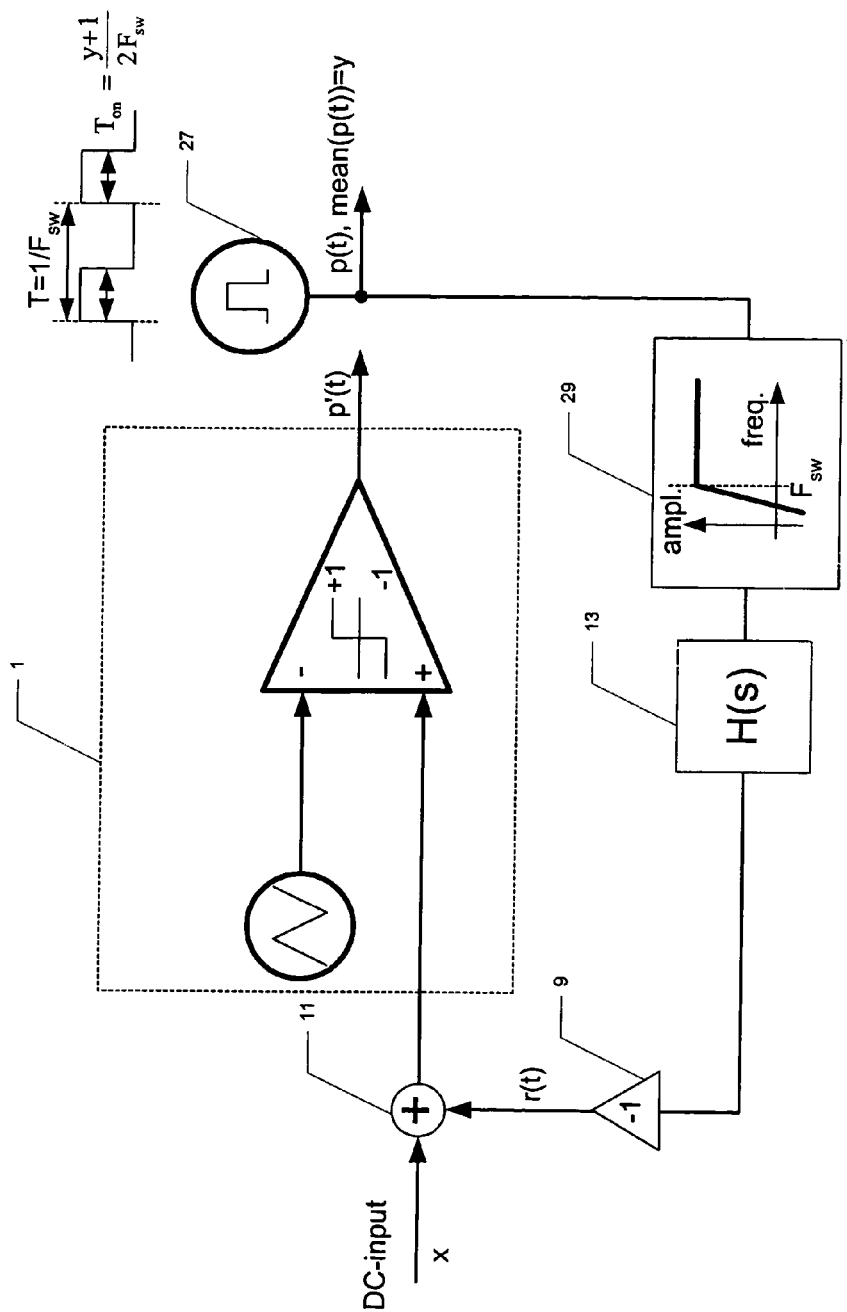
FIG. 5a is an electrical diagram illustrating an analytical model.

It has been discovered, according to this invention, that the ripple signal r(t) will introduce a DC error in the output signal. It was discovered, in connection with this invention, that there is not a closed-loop form that expresses this error as a function of the input signal. In connection with this invention, an analytical model of the open-loop operation of a class D audio amplifier, as illustrated in FIG. 5a, was used to derive this relationship. In this model, a DC input level x is applied to PWM modulator 1, which generates an output PWM signal p'(t). This output PWM signal p'(t) is not used in the feedback loop, however. Rather, pulse generator 27 is provided to generate a feedback pulse p(t) having a mean value y, with pulse p(t) applied to ideal high-pass filter 29, and in turn to loop filter 13. The goal of the analytical model is to find a DC input level x that, when applied to PWM modulator 1, produces an output PWM signal p'(t) that is exactly equal to the output p(t) from pulse generator 27. The difference between input level x and the mean level y of the output p(t) constitutes the open-loop DC error.

Figure 5B:
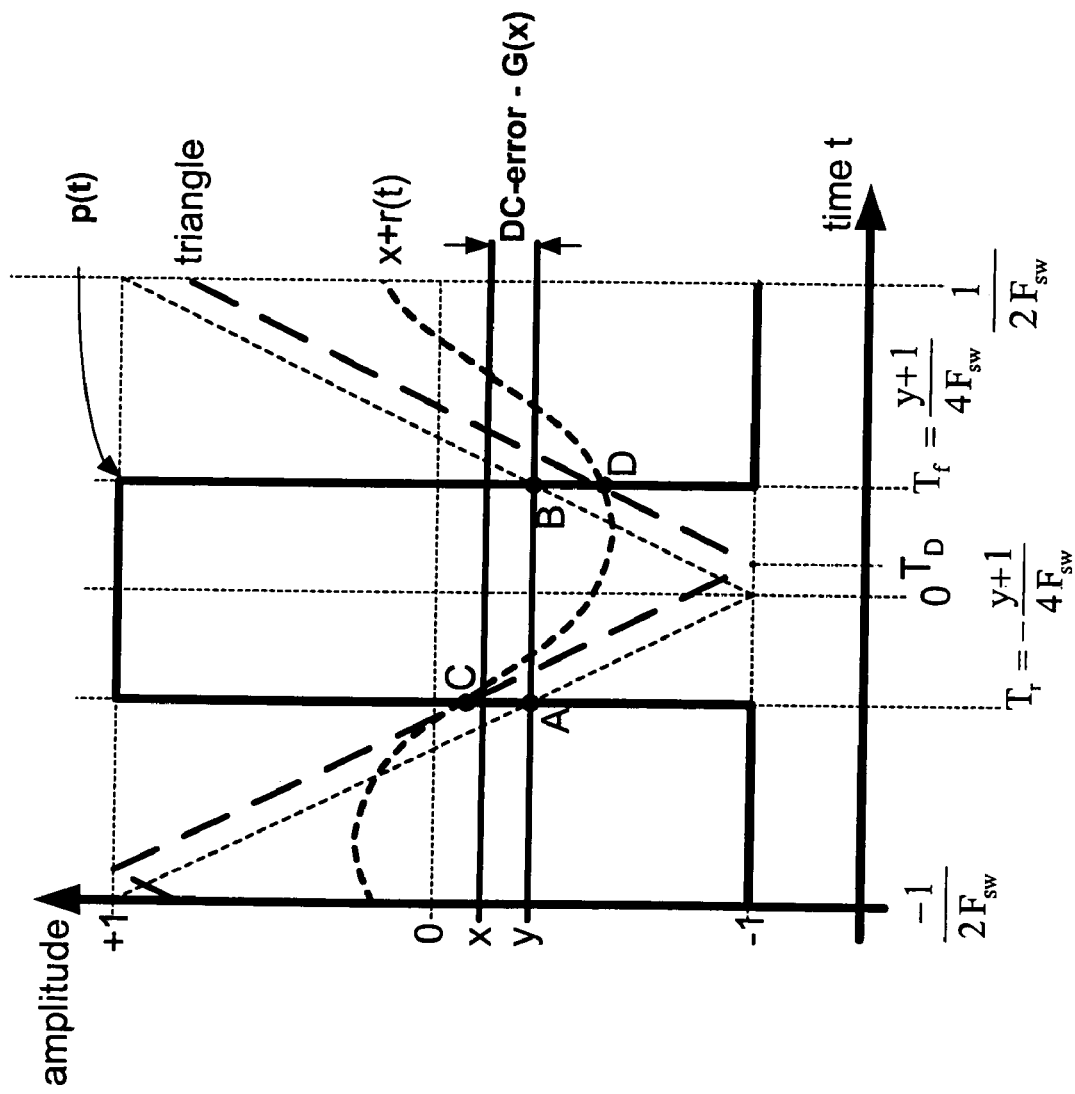
FIGS. 5b and 5c are timing diagrams illustrating the DC error caused by ripple in the feedback loop signal in this analytical model, as observed according to this invention.

For a perfectly linear PWM modulator, one would expect that input level x would exactly equal mean level y. However, ripple signal r(t) from loop filter 13 is added to the DC input level x, and introduces DC error. It is this open-loop DC error G(x)=x−y as a function of input level x that is sought. In FIG. 5b, the signal x+r(t) corresponds to the DC input signal x plus this ripple signal r(t), which is in the form of a periodic waveform of the same frequency as the switching frequency $F_{sw}$ (due to conceptual high-pass filter 29 in the loop). FIG. 5b illustrates the output mean value y, and also the crossing points A, B between the input signal and the triangle waveform that would generate this output mean value y. Because of ripple signal r(t), however, crossing points C and D are the actual crossing points of the input signal x+r(t) with the triangle waveform that provide the output mean value that will result in an output PWM signal p(t)=p'(t) having the output mean value y. The input level x required to place the model circuit of FIG. 5a in this state (i.e., p(t)=p'(t)) is shown in FIG. 5b. The open-loop DC error G(x)=y−x is apparent from FIG. 5b, as is the corresponding phase error corresponding to delay time $T_D$.

Figure 5C:
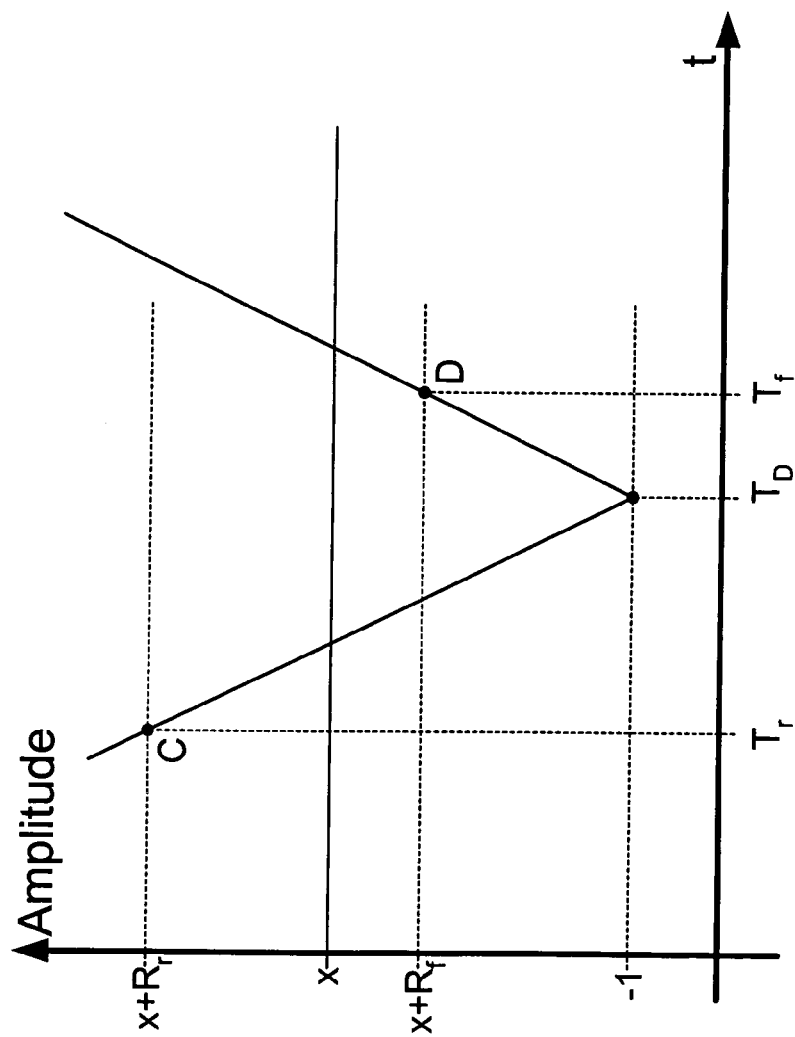

FIG. 5c zooms into the portion of the triangle waveform between about crossing point C and crossing point D. Crossing point C corresponds to the amplitude x+$R_r$ of the input signal when it crosses the triangle waveform at time $T_r$, and crossing point D corresponds to the amplitude x+$R_f$ of the input signal when it crosses the triangle waveform at time $T_f$, as shown. Delay time $T_D$ is the point in time at which the triangle waveform reaches its minimum amplitude (−1), as shown in FIG. 5b. One can derive the phase error as a function of this frequency, considering that times $T_r$ and $T_f$ can be expressed as:

$$T_r = -\frac{y+1}{4F_{sw}} \qquad (7a)$$

$$T_f = \frac{y+1}{4F_{sw}} \qquad (7b)$$

while the ripple values $R_r$, $R_f$ correspond to:

$$R_r = r(T_r) \qquad (8a)$$

$$R_f = r(T_f) \qquad (8b)$$

From FIG. 5b, one can see that the slope of the triangle wave is $4F_{sw}$. Accordingly, one can readily derive:

$$(T_f - T_D)4F_{sw} = x + R_f + 1 \qquad (9a)$$

which can be rearranged to:

$$T_D = T_f - \frac{x + R_f + 1}{4F_{sw}} \qquad (9b)$$

Similarly, $$(T_D - T_r)4F_{sw} = x + R_r + 1 \qquad (9c)$$

and:

$$T_D = T_r + \frac{x + R_r + 1}{4F_{sw}} \qquad (9d)$$

The combination of equations (9b) and (9d) provides:

$$x = 2F_{sw}(T_r - T_D) - 1 - \frac{R_r + R_f}{2} \qquad (10a)$$

and thus:

$$x = y - \frac{R_r + R_f}{2} \qquad (10b)$$

Equation (10b) thus provides an explicit expression for the DC error y−x that results from the ripple signal, from which one can derive the amplitude error function as:

$$G(y) = y - x = \frac{R_r + R_f}{2} \qquad (11)$$

Figure 3:
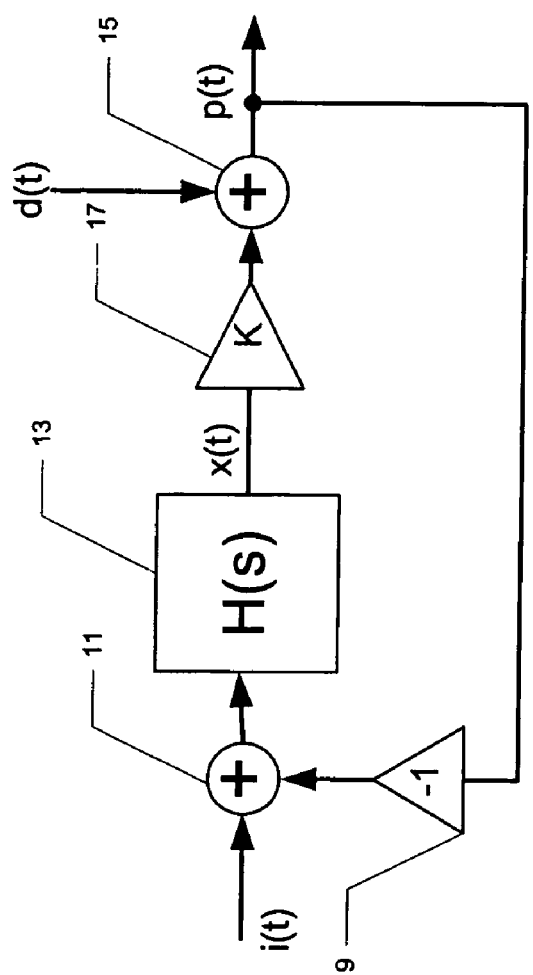
FIG. 3 is an electrical diagram, in block form, modeling the conventional class D amplifier of FIG. 2.
Figure 4:
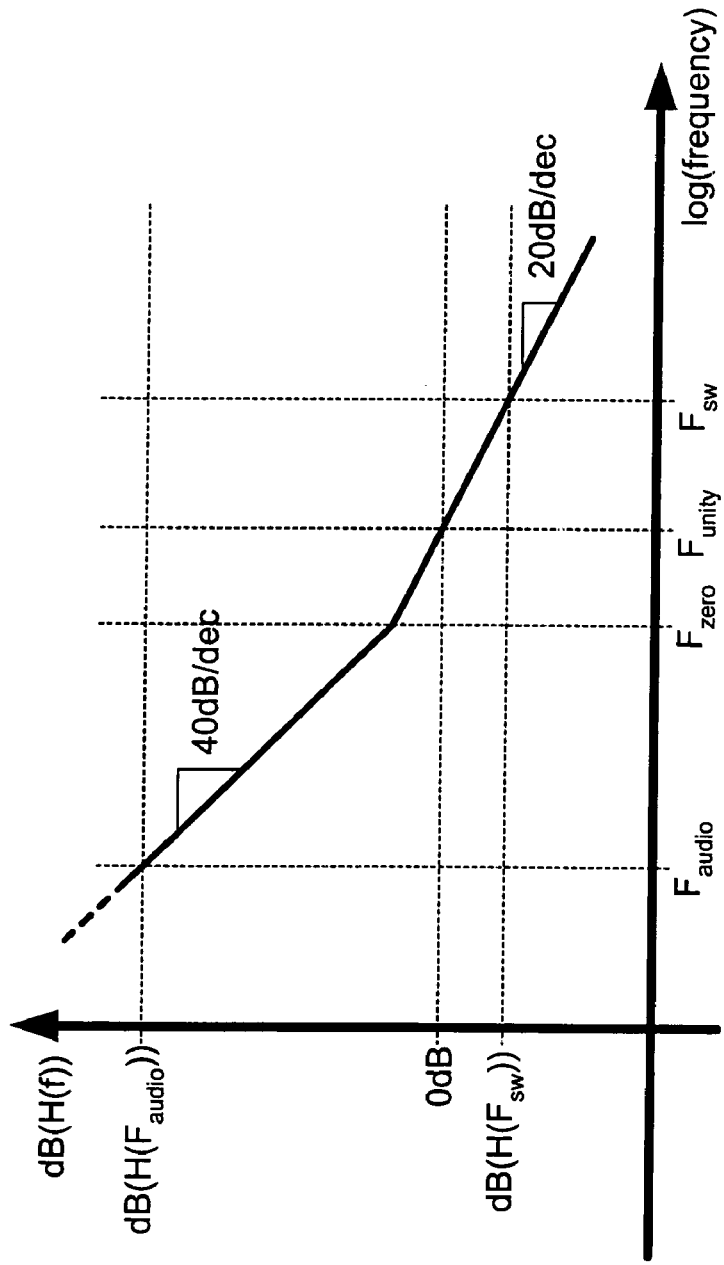
FIG. 4 is a plot of the frequency characteristic of a conventional loop filter.
Figure 6:
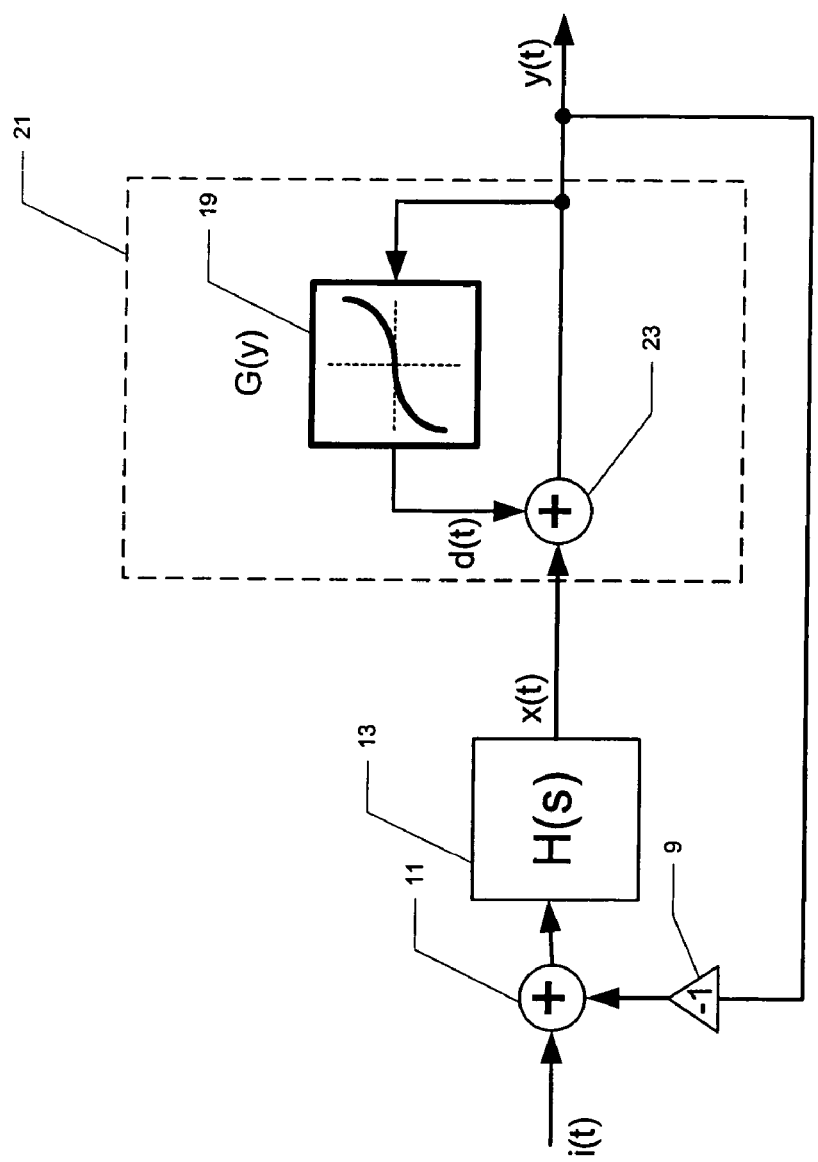
FIG. 6 is an electrical diagram, in block form, of a model of error in a class D amplifier, as observed according to the invention.

Referring now to FIG. 6, it has been discovered, in connection with this invention, that one can consider the entire closed-loop system of FIGS. 2 and 3 as a base-band model in which the PWM modulator and output stage 21 is modeled by an amplitude-error-function 19 having a transfer function G(y), which derives the error signal d(t) from the output signal y(t) that is added to the modulator input signal x(t) by adder 23. In the base-band, which includes low frequencies including the frequencies of interest (e.g., in the audio band) and extending to a certain fraction of the switching frequency $F_{sw}$, analogous to a system having an ideal low pass filter that blocks out all switching related frequency components. Amplitude-error-function 19 of FIG. 6 models the DC aliasing error by a function G(y) that is accurate over these low frequencies, and that will appear as harmonic distortion for a sine wave input x(t). However, as shown by this model, the error function G(y) is introduced inside of the feedback loop, and will therefore be suppressed by the loop filter gain (or, stated another way, shaped by the error transfer function ETF(s)).

As a result, it has been observed, according to this invention, that the harmonic distortion of the system of FIG. 6 is solely a function of loop filter 13 and its transfer function H(s). It has been discovered, according to this invention, that the total harmonic distortion in the system can be reduced by increasing the base-band loop gain in transfer function H(s) to increase suppression of the harmonic distortion at those frequencies, and by optimizing the loop filter so that the open-loop error G(y) is minimized. According to the preferred embodiments of the invention, as will be described below, both of these approaches are used to reduce total harmonic distortion.

Figure 7A:
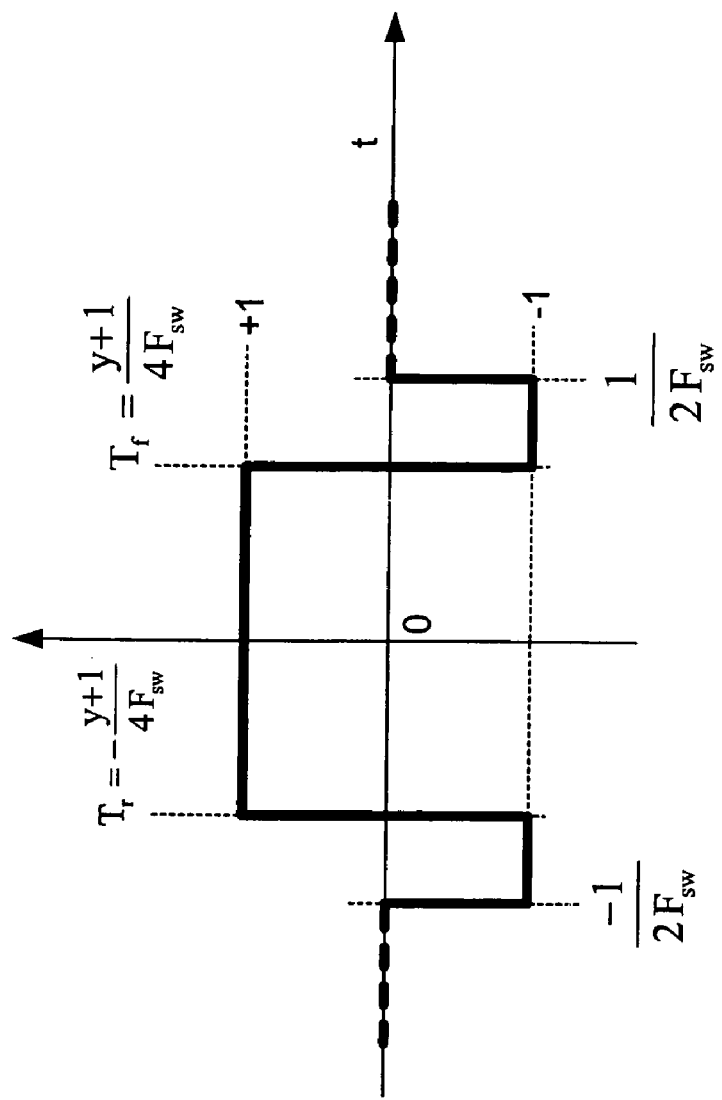
FIGS. 7a and 7b are timing diagrams illustrating a period of a fixed (but arbitrary) duty cycle PWM output signal p(t) and the corresponding error function Fourier series $g_m(y)$ (i.e., for m=1, 2, 3, 4), respectively.

As described above, ripple signal r(t) is the steady-state response of the loop filter 13, and its transfer function H(s), to a periodic pulse train p(t) that is at switching frequency $F_{sw}$. It is instructive to express ripple signal r(t) using Fourier series techniques. FIG. 7a illustrates one period of a fixed (but arbitrary) duty cycle PWM output signal p(t). The Fourier transform $G_p(f)$ of this single-period signal (i.e., all values outside of the illustrated period are zero) is:

$$G_p(f) = \left(\frac{y+1}{F_{sw}}\right)\frac{\sin\left(\pi f \frac{y+1}{2F_{sw}}\right)}{\pi f \frac{y+1}{2F_{sw}}} - \frac{1}{F_{sw}}\frac{\sin\left(\frac{\pi f}{F_{sw}}\right)}{\frac{\pi f}{F_{sw}}} \qquad (12)$$

Because the PWM signal p(t) is effectively the single-period signal of FIG. 8a repeated at switching frequency $F_{sw}$, the repeated signal can be characterized by a Fourier series based on samples of the Fourier transform of equation (12) at multiples of switching frequency $F_{sw}$:

$$G(m) = F_{sw} \cdot G_p(mF_{sw}) \qquad (13)$$

Limiting the value of sinc(0) to unity, the Fourier series becomes:

$$G_m = \frac{2\sin\left(\pi m \frac{y+1}{2}\right)}{\pi m}, \quad \text{for } m \neq 0 \qquad (14)$$
$$= y, \qquad \text{for } m = 0$$

Because $G_0 = y$, the mean value of the PWM output signal p(t) is y, as desired and as described above. Further, the Fourier series is real-valued, and therefore the time domain signal p(t) is even (i.e., p(t)=p(-t)). Ripple signal r(t) can be found by summing this Fourier series $G_m$, weighted by the loop filter transfer function -H(s) sampled at the frequencies $mF_{sw}$. Leaving out the DC coefficient to reflect the ideal conceptual high-pass filter 29 mentioned above:

$$r(t) = \sum_{m=1}^{\infty} -2 \, \exp(i \cdot m \cdot 2\pi F_{sw} \cdot t) \cdot G_m \cdot H(i \cdot m \cdot 2\pi F_{sw}) \qquad (15)$$

This expression permits, with reference to equation (11), the calculation of the error function G(y) from the loop transfer function H(s). In particular:

$$G(y) = \frac{R_r + R_f}{2} = \frac{r\left(-\frac{y-1}{4F_{sw}}\right) + r\left(\frac{y-1}{4F_{sw}}\right)}{2} \qquad (16)$$

$$= \sum_{m=1}^{\infty} -2 \, \cos\left(\frac{m\pi(y+1)}{2}\right) \cdot P_m \cdot \text{Re}\{H(i \cdot m \cdot 2\pi \cdot F_{sw})\}$$

$$= \sum_{m=1}^{\infty} \frac{-4}{\pi m} \cos\left(m\pi \frac{y+1}{2}\right) \cdot \sin\left(m \cdot \pi \frac{y+1}{2}\right) \cdot \text{Re}\{H(i \cdot m \cdot 2\pi \cdot F_{sw})\}$$

$$= \sum_{m=1}^{\infty} \frac{-2}{\pi m} \sin(m\pi \cdot (y+1)) \cdot \text{Re}\{H(i \cdot m \cdot 2\pi \cdot F_{sw})\}$$

$$= \sum_{m=1}^{\infty} \frac{2(-1)^{m+1} \sin(m\pi y)}{\pi m} \text{Re}\{H(i \cdot m \cdot 2\pi \cdot F_{sw})\}$$

$$= \sum_{m=1}^{\infty} g_m(y) h_m, \text{ where } g_m(y) = \frac{2(-1)^{m+1}\sin(m\pi y)}{\pi m} \text{ and } h_m$$

$$= \text{Re}\{H(i \cdot m \cdot 2\pi \cdot F_{sw})\}$$

Derivation (16) illustrates that the imaginary part of the loop filter transfer function H(s) does not contribute at all to the error function G(y). This can be intuitively seen by considering ripple signal r(t) as the sum of even and odd parts:

$$r(t) = r_{odd}(t) + r_{even}(t) \qquad (17)$$

Odd part $r_{odd}(t)$ is defined by the sine terms of the Fourier series for ripple signal r(t), which is defined solely by the imaginary part of transfer function H(s), because PWM output signal p(t) is an even function as mentioned above. But equation (11) establishes that the odd part of ripple signal r(t) will not contribute at all to the error function G(y). As a consequence, only even part $r_{even}(t)$ of ripple signal r(t) win affect error function G(y). This is used to advantage in the design of the loop filter in the class D amplifier according to the preferred embodiments of the invention, as will be described below.

Figure 7B:
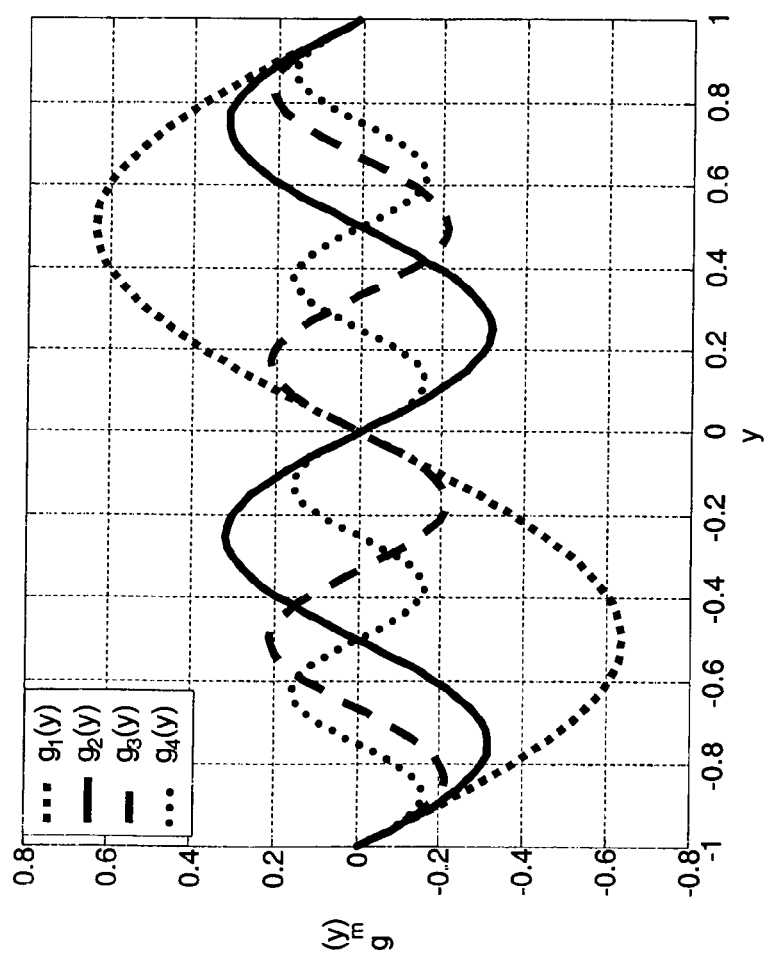

Analysis of the first four terms of the error function Fourier series $g_m(y)$ (i.e., for m=1, 2, 3, 4) is illustrated in FIG. 7b. As shown, the error function G(y) is zero at output values y=0, y=+1, and y=-1. This means that there is no DC error for zero, or full scale (positive or negative) output from the system. This behavior is also used to advantage in the class D amplifier according to the preferred embodiments of the invention, as will be described below.

Figure 8:
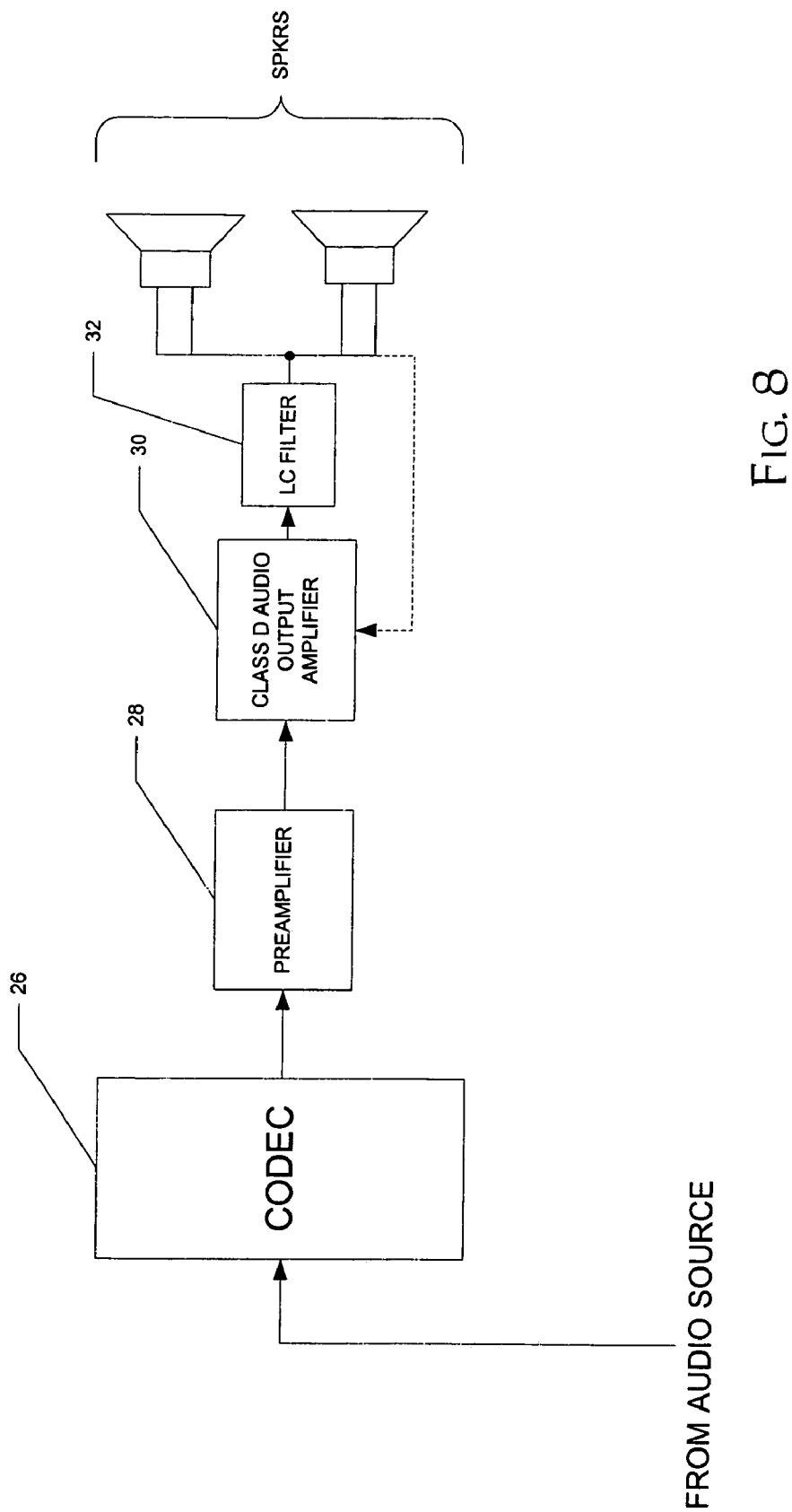
FIG. 8 is an electrical diagram, in block form, of an audio system constructed according to the preferred embodiments of the invention.

Referring next to FIG. 8, a system incorporating the class D amplifier according to the preferred embodiments of the invention will first be described, to provide context for the invention. FIG. 8 illustrates an audio system that includes audio output amplifier circuitry according to the preferred embodiment of the invention. The audio system of FIG. 8 may represent a standalone audio system, such as an automobile, portable, or bookshelf sound system, or alternatively may be implemented within an audio-visual system, such as a television set. It is contemplated that this invention is applicable to audio systems in any number of applications, including these types of audio systems, and also in other systems that provide audio output.

In the system of FIG. 8, an audio source provides audio signals to coder/decoder (codec) 26. The audio source may be any one of a number of conventional sources of digital or analog audio information, including compact disc (CD) or digital video disk (DVD) players, a computer forwarding digital audio information such as in the form of MPEG data, sources of analog audio information such as from microphones and musical instrument pickups, or audio signals communicated by conventional broadcast or cable television sources. The audio signal, if in the digital domain, may be also be processed by conventional digital signal processing routines, including filtering and the like, by a digital signal processor (DSP) such as the 320C5x digital signal processors available from Texas Instruments Incorporated. Codec 26 is a conventional codec device, including such functions as analog-to-digital converters (ADCs) and digital-to-analog converters (DACs), oversampling digital interpolation filters, sigma-delta modulators, and the like. An example of a suitable codec 26 is the TLV320AIC23B high-performance stereo audio codec available from Texas Instruments Incorporated.

The output of codec 26 is applied to preamplifier 28. These signals may be communicated as a real-time differential analog voltage for each audio channel, or alternatively as a single-ended signal, depending upon the system application. Preamplifier 28 may be a conventional audio preamplifier, realized by relatively low-voltage devices, relative to the class D power amplifier 30. According to this embodiment of the invention, preamplifier 28 amplifies the codec output, and applies the amplified signal to class D audio output amplifier 30. Class D audio output amplifier 30, via LC filter 32, drives one or more speakers SPKRS with pulse-width modulated (PWM) rail-to-rail signals. As shown in FIG. 7, an optional feedback path is provided from the output of LC filter 32 back into class D audio output amplifier 30; this feedback arrangement will be described in detail relative to one of the preferred embodiments of the invention.

Figure 9:
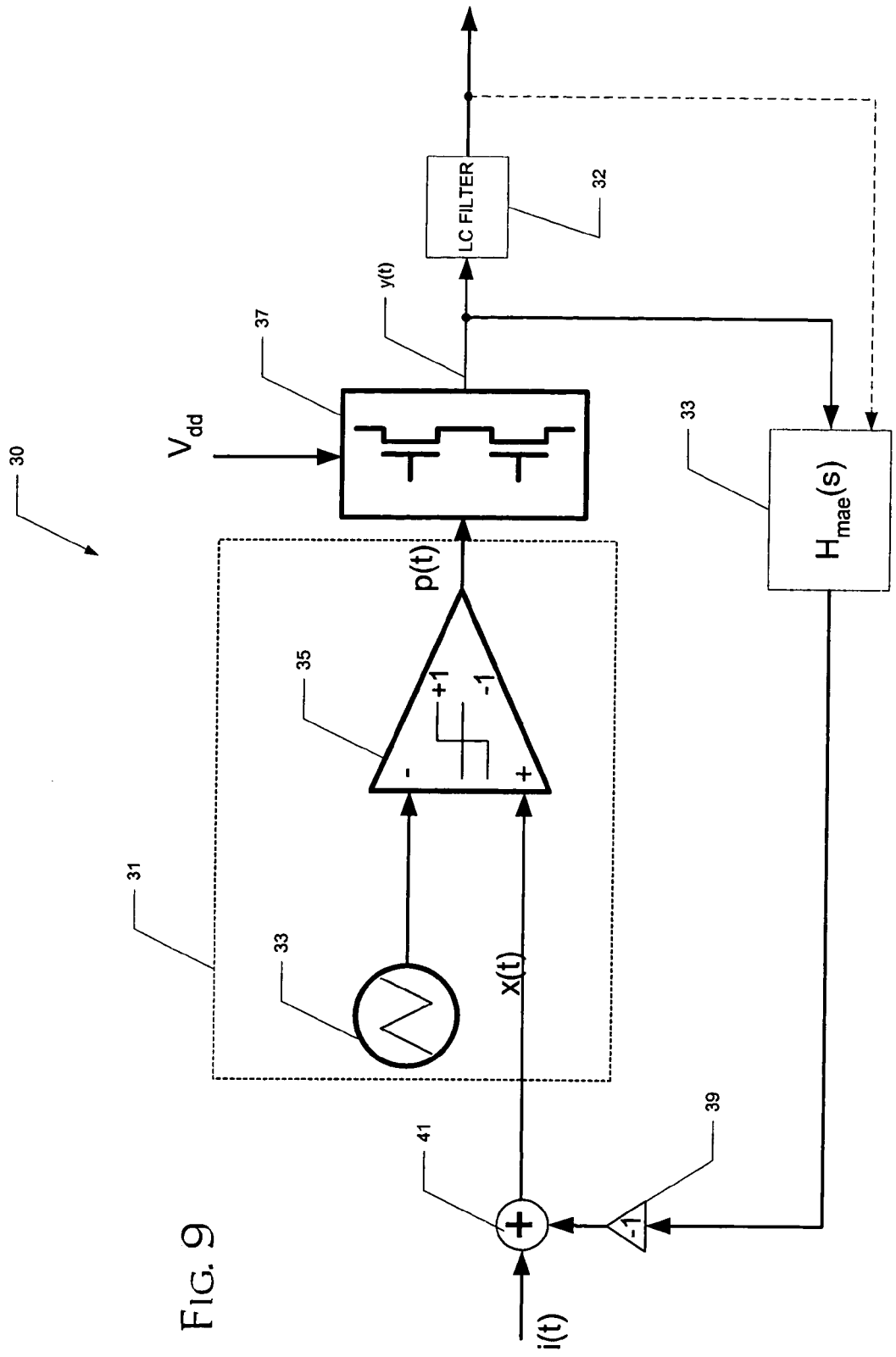
FIG. 9 is an electrical diagram, in block form, of the audio amplifier in the system of FIG. 8 constructed according to the preferred embodiments of the invention.

FIG. 9 illustrates the construction of class D audio output amplifier according to the preferred embodiments of the invention, in a generalized form. As shown in FIG. 9, PWM modulator 31 includes triangle waveform generator 33 and comparator 35, and generates PWM output signal p(t) in response to the comparison between the current level of input signal x(t) and the current level of the triangle wave from generator 33. PWM output signal p(t) controls the drive of power transistors in power stage 37, the output of which is applied, as output signal y(t), to LC filter 32 (as in FIG. 8). The filtered output of LC filter is the ultimate signal applied to a load, such as audio speakers (FIG. 8).

According to the preferred embodiments of the invention, loop filter 33 receives a feedback signal corresponding to the output signal y(t) from power stage 37. Optionally, as will be described below, a second feedback signal may also be received from the output of LC filter 32, such that LC filter 32 is also within the feedback loop. The output of loop filter 32 is a feedback signal that is subtracted (by operation of inverter 39 and adder 41) from the input audio signal i(t) that is received from a codec or other audio source.

According to the preferred embodiments of the invention, the transfer function $H_{mae}(s)$ applied by loop filter 33 is a minimum-aliasing-error loop filter. This transfer function $H_{mae}(s)$ is selected to provide reduced phase (and therefore increased phase margin), while also having a reduced real part at multiples of the switching frequency $F_{sw}$, as described above.

As described above relative to equation (6), the conventional loop filter includes a weighted sum of first-order and second-order loops. For purposes of comparison, it is therefore useful to consider the first-order and second-order integrator feedback loops of this conventional transfer function as defining a piece-wise linear characteristic. First, the $h_m$ series of the second-order loop filter is:

$$h2_m = \text{Re}\left(\frac{K_2}{(i2\pi m F_{sw})^2}\right) = -\frac{K_2}{4\pi^2 m^2}\frac{1}{F_{sw}^2} \quad (18)$$

Next, the first order one pole filter has the transfer function:

$$Ha(s) = \frac{K_1 p}{s+p} \quad (19)$$

where p is the pole frequency. This first order filter provides an $h_m$ series of:

$$ha_m = \text{Re}\left(\frac{K_1 p}{i2\pi m F_{sw}+p}\right) = \frac{K_1 p^2}{4\pi^2 m^2 F_{sw}^2 + p^2} \quad (20)$$

The error function of the summed transfer function (i.e., the sum of the first-order and second-order loops) can be minimized by setting the weights:

$$K_1 p^2 = K_2 \quad (21a)$$

or:

$$p = \sqrt{\frac{K_2}{K_1}} \quad (21b)$$

One can evaluate the second-order integrator transfer function $$H2(s) = K_2/s^2$$

of the conventional second-order integrator at s=ip:

$$H2(s=ip) = \frac{K_2}{\left(i\sqrt{\frac{K_2}{K_1}}\right)^2} = -K_1 \quad (22)$$

Figure 10:
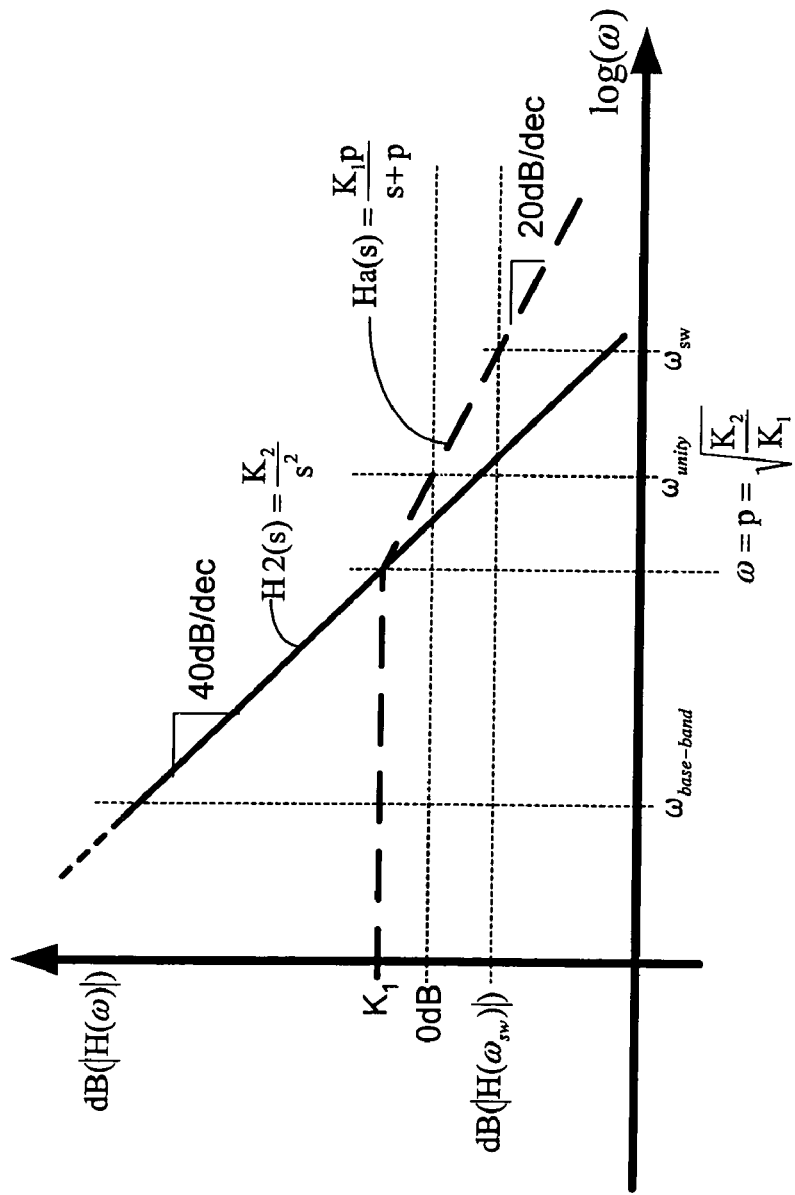
FIG. 10 is a frequency response plot of a loop filter according to the preferred embodiments of the invention.

As a result, the traditional piece-wise linear approximations of the amplitude responses of the first-order and second-order loops results in the approximations intersecting at the real pole p as shown in FIG. 10.

According to the preferred embodiments of the invention, the transfer function $H_{mae}(s)$ for loop filter 33 in amplifier 30 of FIG. 9 is:

$$H_{mae}(s) = \quad (23)$$

$$\frac{K_1 p}{s+p} + \frac{K_2}{s^2} = \frac{K_1 \sqrt{\frac{K_2}{K_1}}}{s + \sqrt{\frac{K_2}{K_1}}} + \frac{K_2}{s^2} = \frac{K_2 \left(s + \sqrt{\frac{K_2}{K_1}}\right) + s^2 \sqrt{K_1 K_2}}{s^2 \left(s + \sqrt{\frac{K_2}{K_1}}\right)}$$

This example of transfer function $H_{mae}(s)$ is a third-order function, with a double pole at zero frequency and a real pole at $-p$. The zeros of transfer function $H_{mae}(s)$ are complex, and located at $$s = \frac{K_2 \pm i\sqrt{3}\, K_2}{2}.$$

Figure 11:
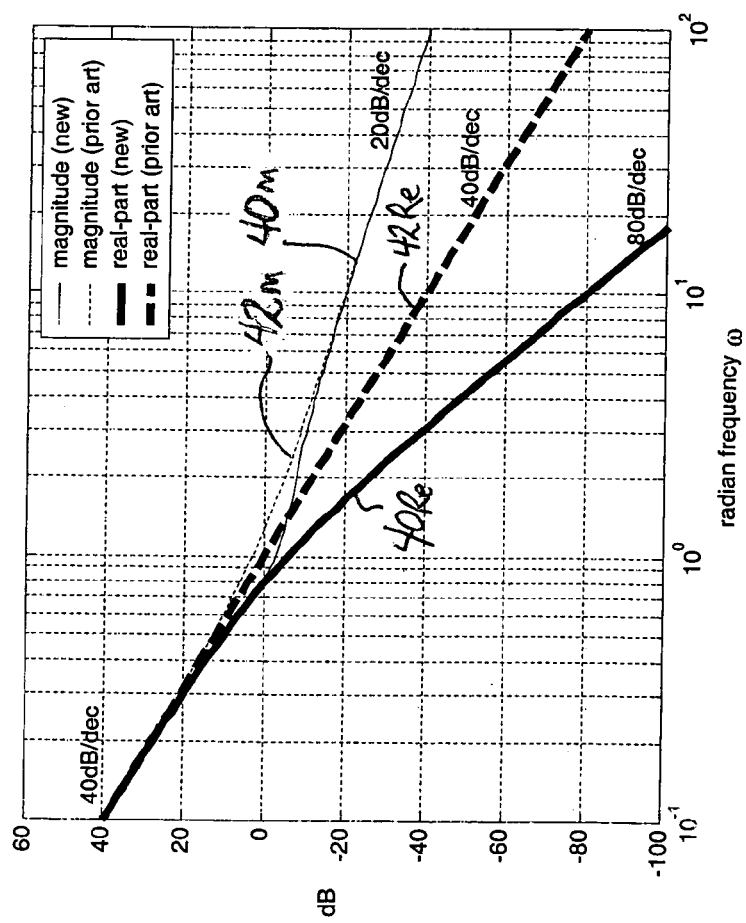
FIG. 11 is a frequency response plot illustrating the magnitude and real parts of a loop filter according to the preferred embodiments of the invention as compared with a conventional loop filter.

The plots of the magnitude response and the real part of the response of this new transfer function $H_{mae}(s)$ and the conventional transfer function $H(s)$ described by equations (18) through (22) are shown in FIG. 11.

In FIG. 11, plot 42m is the magnitude plot of the conventional weighted-sum filter transfer function $H(s)$ following equation (6) for the case of $K_1=K_2=1$, and plot 42Re is the plot of the real part of this transfer function $H(s)$. Plot 40m, on the other hand, is the magnitude plot of the transfer function $H_{mae}(s)$ following equation (23) for the case of $K_1=K_2=p=1$ for loop filter 33 in amplifier 30 according to the preferred embodiment of the invention, while plot 40Re plots the real part of this transfer function $H_{mae}(s)$. As evident from FIG. 11, magnitude plots 40m, 42m are quite similar to one another, with at most a 4 to 5 dB difference at a radian frequency $\omega=1$.

However, as intended according to the preferred embodiments of the invention, the real part of transfer function $H_{mae}(s)$ for loop filter 33 according to the preferred embodiments of the invention, as shown by plot 40Re, has a much steeper slope (on the order of 80 dB/decade) at frequencies above radian frequency $\omega=p=1$ than does the real part of the conventional transfer function $H(s)$ as shown by plot 42Re (which has a slope of on the order of 40 dB/decade). This steeper real part for new transfer function $H_{mae}(s)$ results in a much lower aliasing error than the conventional transfer function $H(s)$. Indeed, the reduction in aliasing error relative to the aliasing error for the conventional loop filter of equation (6) is roughly about the square of the ratio of the switching frequency $\omega_{sw}$ to the pole frequency $\omega=p$.

Figure 14:
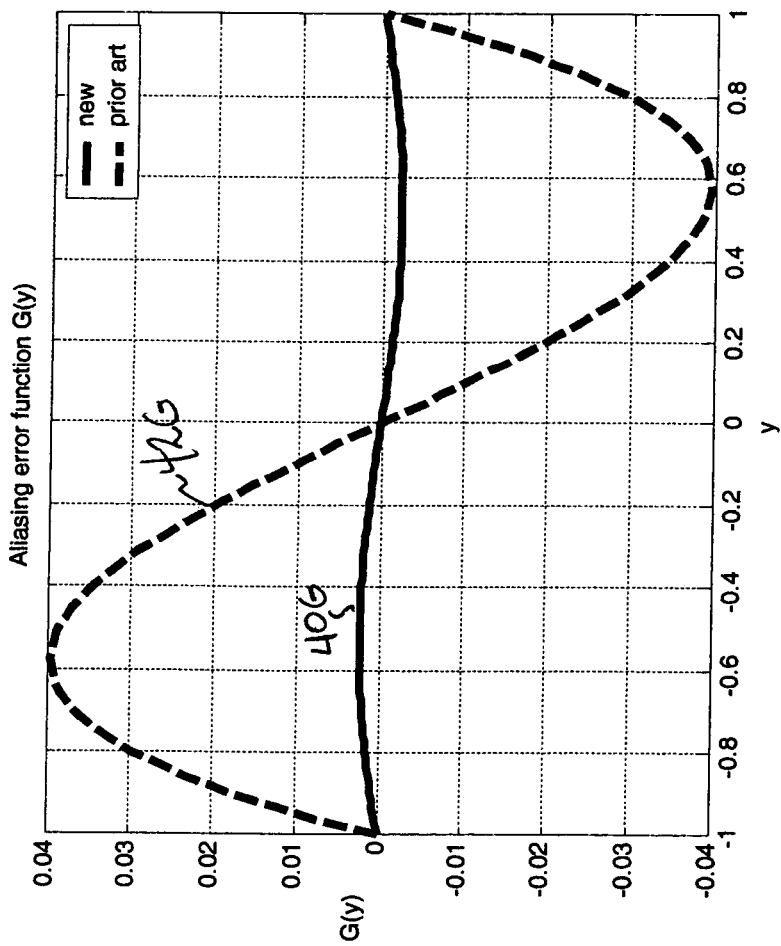
FIG. 14 is a plot of the aliasing error function of a loop filter according to the preferred embodiments of the invention as compared with a conventional loop filter.

This difference in aliasing error is shown in FIG. 14, which illustrates plots 40G, 42G of the aliasing error function $G(y)$ for new transfer function $H_{mae}(s)$ and conventional transfer function $H(s)$, respectively, for the example of a switching frequency at $\omega_{sw}=4$ rad/sec. The greatly reduced aliasing error resulting from the new transfer function $H_{mae}(s)$ is readily apparent from FIG. 14, with the peak error being only about 0.00235 as compared with a peak error of about 0.04 for the conventional loop filter. This reduction of aliasing error is in accordance with the square-law prediction mentioned above, which predicts an aliasing error reduction by a factor of $(\omega_{sw}/p)^2=16$. The peak error of 4% for the conventional loop filter would be expected to dominate over the open-loop error in a well-designed switching power stage.

Figure 12:
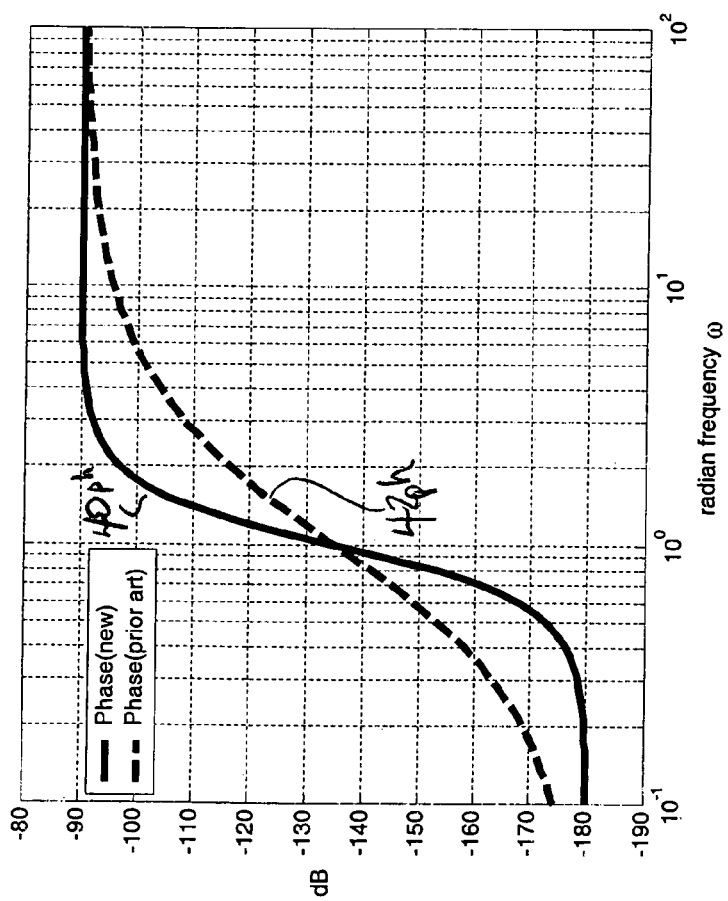
FIG. 12 is a plot of the phase response of a loop filter according to the preferred embodiments of the invention as compared with a conventional loop filter.

FIG. 12 illustrates phase plot 42ph for the conventional loop filter transfer function $H(s)$, and phase plot 40ph for the new transfer function $H_{mae}(s)$ according to the preferred embodiments of the invention. As shown by phase plot 40ph, the phase characteristic for the new transfer function $H_{mae}(s)$ is much sharper in its transition from $-180°$ to $-90°$ in phase, around pole frequency p, than is the phase characteristic for conventional transfer function $H(s)$ as shown by phase plot 42ph.

Figure 13:
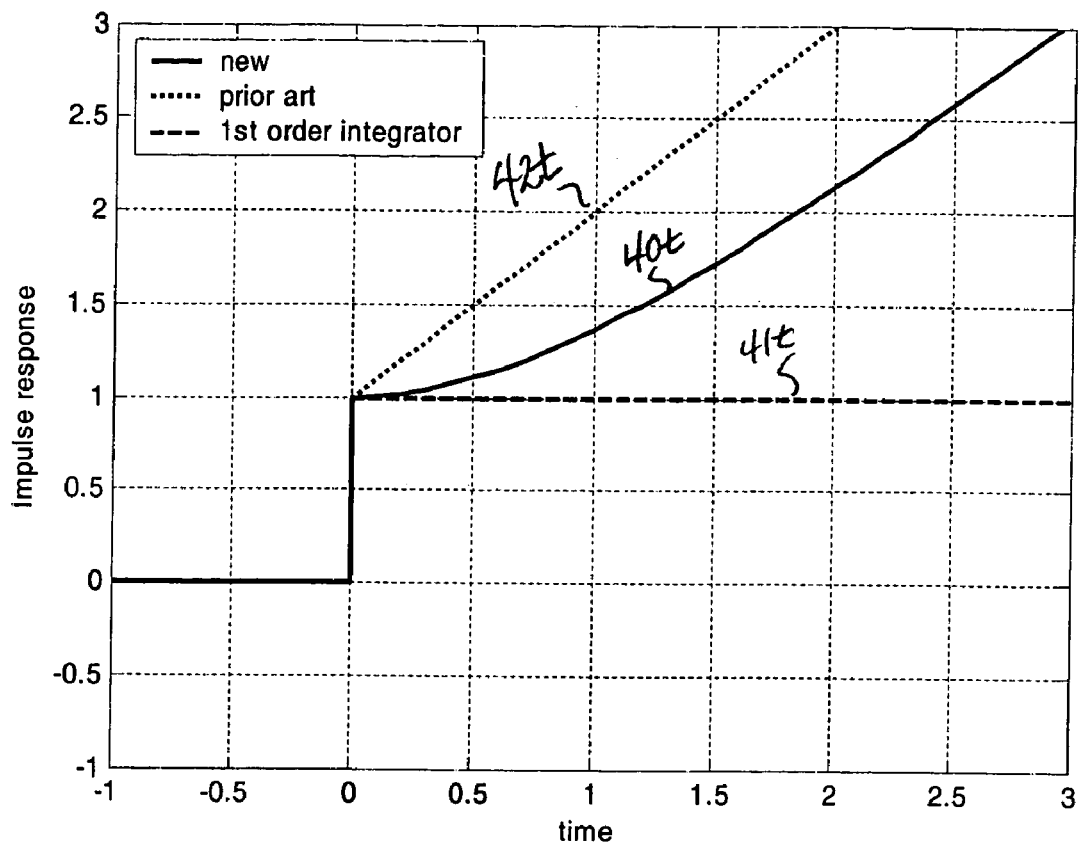
FIG. 13 is a plot of the time-domain impulse response of a loop filter according to the preferred embodiments of the invention as compared with a conventional loop filter and with a first-order integrator.

FIG. 13 illustrates the time-domain impulse response of a first-order integrator, of the conventional loop filter, and of the loop filter having transfer function $H_{mae}(s)$ and constructed according to the preferred embodiments of the invention. Plot 41t in FIG. 13 illustrates the well-known step function response of a conventional first-order integrator to a unit impulse at time t=0. Plot 42t illustrates the impulse response of the conventional weighted sum loop filter, for example as described in the Berkhout article mentioned above. As evident from plot 42t, the impulse response of this conventional loop filter is effectively the sum of a first-order integrator (i.e., the step function at time t=0) with the linear integration of a second-order integrator. In contrast, plot 40t of the loop filter according to the preferred embodiments of the invention, with the new transfer function $H(s)$, has an impulse response that approximates the impulse response of the first-order integrator of plot 41t at short time intervals following time t=0. This is evident by the portion of plot 40t with approximately zero slope shortly following t=0. At longer time intervals, however, the loop filter according to the preferred embodiments of the invention has an impulse response that asymptotically approaches the linear ramp of the second-order conventional loop filter. FIG. 13 illustrates this by the tangent of plot 40t asymptotically approaching the linear slope of plot 42t for the conventional loop filter. In contrast, the conventional second-order loop filter impulse response has a fixed slope of unity for t>0. This time-domain behavior of the loop filter according to the preferred embodiments of the invention, with the new transfer function $H_{mae}(s)$, is reflected by its low aliasing error, by approximating the error-free first-order integrator at short time scales, while having higher loop gain at low frequencies as evidenced by the second-order integrator term.

The minimum-aliasing-error loop filter described above relative to equation (23) can be further extended to include a third-order integrator term $$K_3/s^3$$

without changing the real part of the transfer function $H_{mae}(s)$. This provides further improvement in low frequency loop gain (i.e., reflected at longer time intervals in the impulse response of FIG. 13), without adding aliasing error. It is further contemplated that additional correction terms can be added into the transfer function $H_{mae}(s)$ that further reduce its real part at multiples of switching frequency $F_{sw}$, for example achieving a 120 dB/decade slope of the real part at higher frequencies. Integrator terms of even higher order can also be added; in this regard, it has been observed that all even-order integrator terms ($2^{nd}$, $4^{th}$, $6^{th}$ order, etc.) will benefit from additional correction terms that reduce the real part of the transfer function. However, the $2^{nd}$ order integrator term is typically the dominant contribution to the real part of the transfer function and thus requires the most care in selecting the proper correction terms to reduce the real value.

Figure 15:
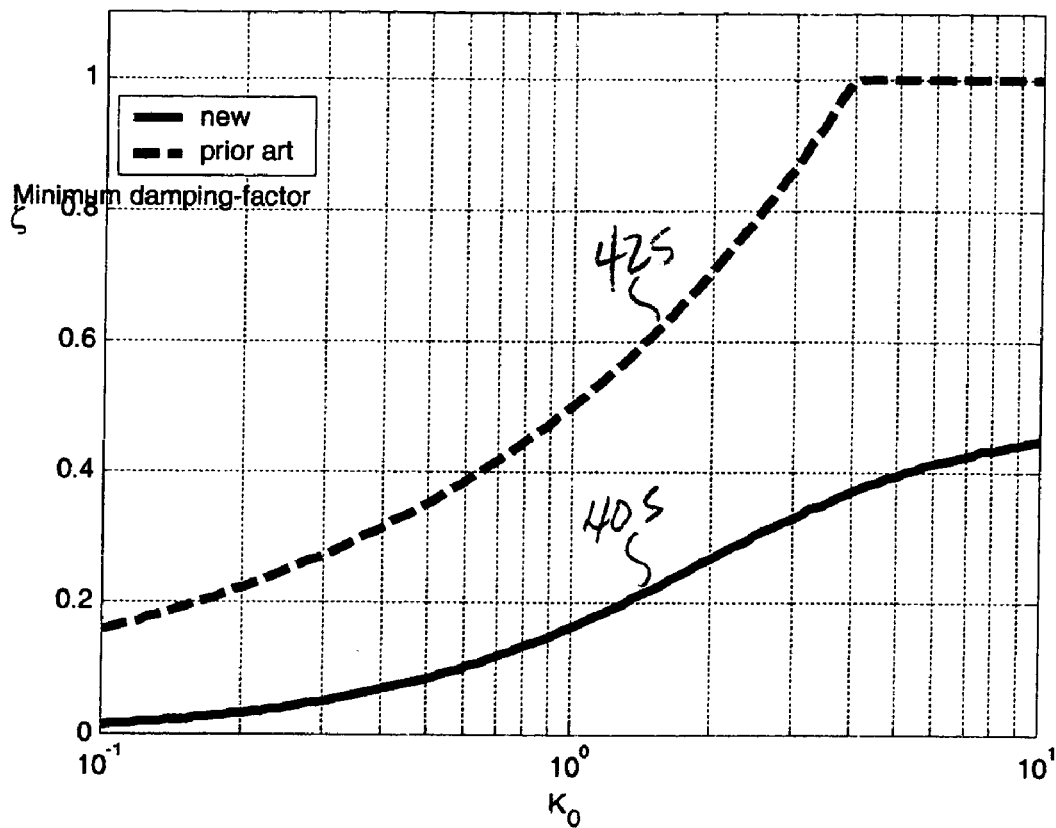
FIG. 15 is a plot of the minimum damping factor of a loop filter according to the preferred embodiments of the invention as compared with a conventional loop filter.

As described above, stability of the loop filter characteristic is important in realizing a high fidelity class D amplifier. Stability can be analyzed by defining a damping factor ξ from the poles of the error transfer function $$ETF(s) = \frac{1}{1 + K_0 + H_{mae}(s)}$$

as a function of loop gain $K_0$. For a complex pole-pair q, this damping factor ξ becomes:

$$\xi = -\frac{\text{Re}\{q\}}{|q|} \quad (24)$$

namely, the ratio of the negative real part of the pole to its magnitude. Stable systems have a minimum damping factor for all complex poles that is greater than zero, and a damping factor of unity indicates that the poles are real and in the left-hand plane (i.e., critically-damped, or over-damped if the damping factor is above unity). FIG. 15 shows plots 40S, 42S, which are plots of the stability factor for the conventional transfer function H(s) and new transfer function $H_{mae}(s)$. As shown in FIG. 15, the conventional loop filter is critically-damped (with a damping factor ξ of unity at $K_0=4$ due to a double real pole), while the damping factor ξ for the new transfer function is only 0.37 at this $K_0$. This relative loss of stability should be taken into consideration in implementing the loop filter according to the preferred embodiments of the invention. It has been further discovered, in connection with this invention, that the stability of the minimum-aliasing-error loop filter according to the preferred embodiments of the invention can be further improved (i.e., damping factor ξ increased) by adding a first-order integrator term, which will not change the aliasing error because of the zero real part of the 1/s first-order integrator transfer function. In addition, it has been observed that the aliasing error G(y) due to propagation delays in power output stage 37 and comparator 35 is substantially linear up to a certain amplitude of output amplitude y. However, this amplitude limit scales with a scaling factor k applied to the gain (nominally unity). As such, the aliasing error due to system delay should be considered as the gain of the closed loop is designed.

Ripple instability is also preferably considered in the design of loop filter 33 according to the preferred embodiments of the invention, by ensuring that the slope of the ripple signal is lower than the slope of the triangular waveform, as mentioned above. It has been discovered, in connection with this invention, that ripple instability can be assured for a first-order integrator loop filter $$K_1/s$$

with:

$$K_1(1 + |y|) < \frac{4}{S_w} \Rightarrow K_1 \leq \frac{4}{(1+|y|)F_{sw}} \leq \frac{2}{F_{sw}} \quad (25)$$

This is consistent with the conventional rule of thumb that ripple stability is assured by the unity gain point of the loop being at least a factor of is below the switching frequency $F_{sw}$; conversely, the magnitude of transfer function $H_{mae}(s)$ at switching frequency $F_{sw}$ should be less than 1/π.

As mentioned above relative to FIG. 9, the preferred embodiments of the invention provide loop filter 33 that receives a first feedback input from the output of power stage 37, and optionally receives a second feedback input from the output of LC filter 32, such that the characteristic of LC filter 32 itself is involved in the feedback loop. According to a first preferred embodiment of the invention, therefore, only the feedback input from the output of power stage 37 is applied to loop filter 33. In this event, the desired transfer function $H_{mae}(s)$ is implemented entirely within loop filter 33. It is contemplated that those skilled in the art having reference to this specification will be readily able to realize this transfer function $H_{mae}(s)$ in loop filter 33, for example by a conventional arrangement of operational amplifiers and passive components.

According to a second preferred embodiment of the invention, feedback inputs to loop filter 33 are received both from the output of power stage 37, and also from the output of LC filter 32. As mentioned above, this provides the important benefits of involving LC filter 32 itself in the loop, so that any error due to LC filter 32 itself is compensated in the operation of amplifier 30. In addition, any error caused by variations in the ultimate load impedance can similarly be compensated to some extent. Finally, the transfer function of LC filter 32 itself can be incorporated into the loop filter transfer function $H_{mae}(s)$, which can simplify the realization of loop filter 33.

Figure 16:
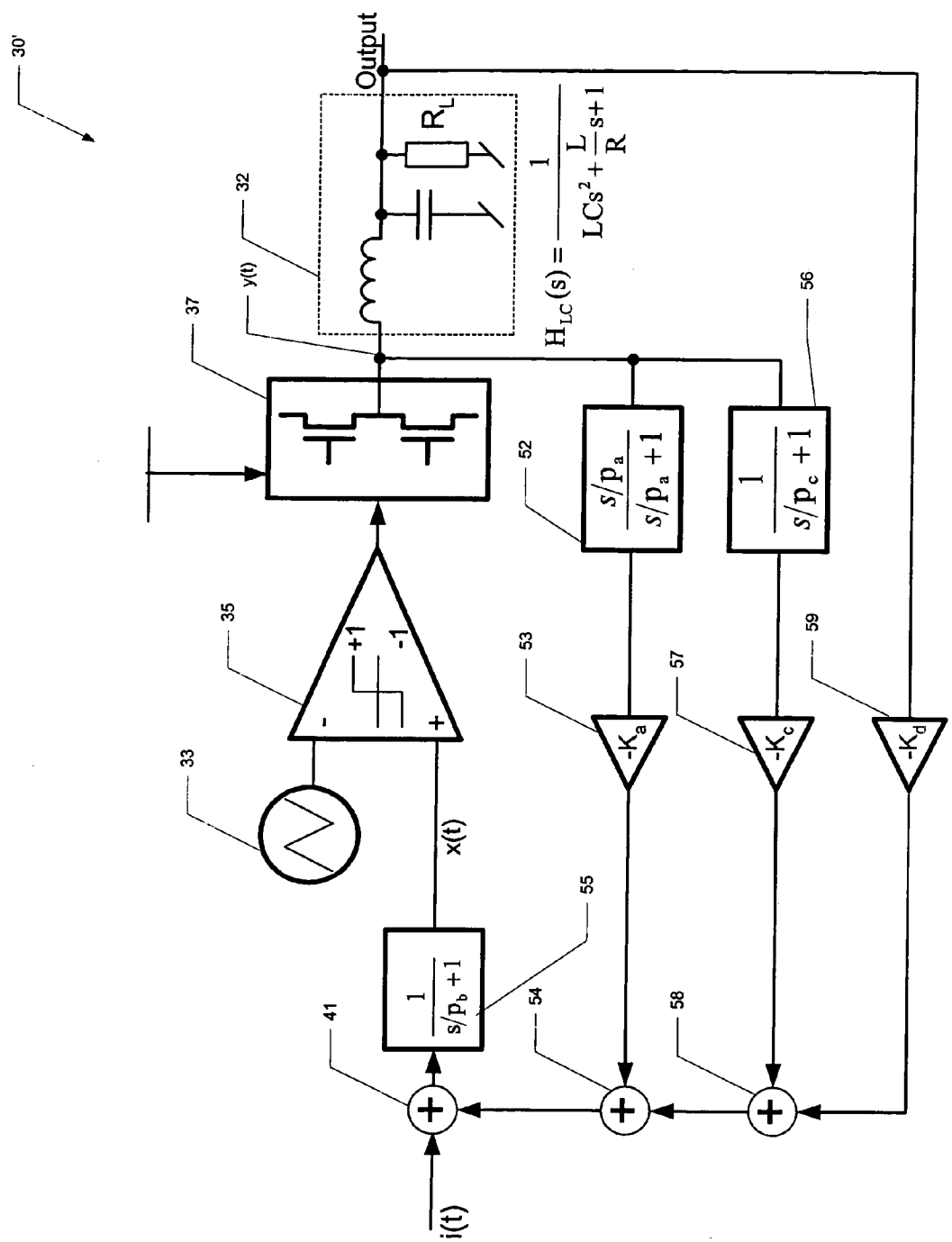
FIG. 16 is an electrical diagram, in block form, of an audio amplifier according to a second preferred embodiment of the invention.

FIG. 16 illustrates a class D audio amplifier 30' constructed according to this second preferred embodiment of the invention. In this embodiment of the invention, as before, PWM modulation is performed by comparator 35, which generates PWM output signal p(t) in response to the comparison between the current level of input signal x(t) and the current level of the triangle wave from generator 33. PWM output signal p(t) controls the drive of power transistors in power stage 37, the output of which is applied, as output signal y(t), to LC filter 32. The output of LC filter 32 is forwarded to the ultimate load of amplifier 30'.

According to this embodiment of the invention, the loop filter is realized by three feedback paths, together with filter function 43 that is applied to the output of adder 41. Adder 41 receives a summed signal from the three feedback paths, and adds this summed signal to the audio input signal i(t); the output of adder 41 is forwarded to filter function 43, which in turn drives signal x(t) to comparator 35.

A first feedback path in amplifier 30' from the output of power stage 37 is filtered by filter function 52 with a filter having a transfer function $$\frac{s/p_a}{s/p_a + 1}.$$

The output of filter function 52 is applied to gain stage 53, which applies a gain of $-K_a$. The output of gain stage 53 is applied to an input of adder 54. A second feedback path in amplifier 30' also receives the output of power stage 37, and includes filter function 56 with a transfer function $$\frac{1}{s/p_a + 1}.$$

The output of filter function 56 is amplified by gain stage 57, with a gain of $-K_c$, and the amplified signal is applied to an input of adder 58.

According to this second preferred embodiment of the invention, a third feedback path includes gain stage 59, which receives the output of LC filter 32 and applies a gain of $-K_d$. Because this third feedback path is taken from the output of LC filter 32, this third path in effect applies the transfer function $H_{LC}$ of LC filter 32 to the output signal y(t). As such, the feedback signal includes this transfer function $H_{LC}$, which in this example is $$H_{LC}(s) = \frac{1}{LCs^2 + \frac{L}{R}s + 1}.$$

After application of the gain of $-K_d$ by gain stage 59, the resulting signal is applied to a second input of adder 58. The output of adder 58 is applied to a second input of adder 54, the output of which is applied as the summed feedback signal to a second input of adder 41.

Filter function 56 filters the difference signal from adder 41 with the transfer function $$\frac{1}{s/p_b + 1},$$

according to this embodiment of the invention. The output of filter function 56 is applied to comparator 35, as signal x(t).

According to this construction of this second preferred embodiment of the invention, the overall transfer function $H_{mae}(s)$ in amplifier 30' is:

$$H_{mae}(s) = \left[K_d \frac{1}{LCs^2 + \frac{L}{R}s + 1} + K_a \frac{\frac{s}{p_a}}{\frac{s}{p_a} + 1} + K_c \frac{1}{\frac{s}{p_c} + 1}\right] \frac{1}{\frac{s}{p_b} + 1} \quad (26)$$

According to the preferred embodiments of the invention, the parameters of the gains K and poles p are optimized to obtain the properties of the transfer function $H_{mae}(s)$ described in this specification. In general, the inner term with the gain $K_d$ (i.e., the term due to LC filter 32) corresponds to a two-pole low-pass filter, appearing at high frequencies (i.e., at frequencies above the switching frequency) as a double integrator. The first-order inner $K_a$ and $K_c$ terms, in combination with the outer first-order low-pass with pole $p_b$, serve as correction terms to reduce the real-part contribution of the double integrator term (LC filter 32) and to ensure that the total loop filter magnitude response slope is about 6 dB/octave above the switching frequency. The combination of filter parameters ($K_a$, $K_c$, $K_d$, $p_a$, $p_b$, $p_c$ and L, C, R) provide enough degrees of freedom to facilitate the identification of a solution meeting the requirements described in this specification. It is contemplated that those skilled in the art having reference to this specification will be readily able to perform the appropriate optimization for a particular application and, once the optimization is accomplished, to select the values of the passive components L, C, R according to conventional techniques.

According to the preferred embodiments of the invention, the transfer function $H_{mae}(s)$ is optimized to have the desired properties, namely having an amplitude response that has a maximal negative slope of magnitude versus frequency, below a switching frequency $F_{sw}$, that is flatter than the negative slope of the real part of the response versus frequency for frequencies above switching frequency $F_{sw}$. The transfer function $H_{mae}(s)$ has a real part with a much steeper slope (on the order of 80 dB/decade) at frequencies above a selected frequency $\omega=1$ than conventional filters, resulting in much reduced aliasing error. Additionally, as described above, the phase characteristic for the new transfer function $H_{mae}(s)$ is much sharper in its transition from $-180°$ to $-90°$ in phase, around its pole frequency p, than is the phase characteristic of the transfer function for conventional loop filters.

According to this second preferred embodiment of the invention, it is contemplated that the hardware necessary for realizing this three feedback path amplifier 30' is relatively simple, especially because of the use of LC filter 32 within the feedback loop. An exemplary realization of the loop filter portion of amplifier 30' is illustrated in FIG. 17.

Figure 17:
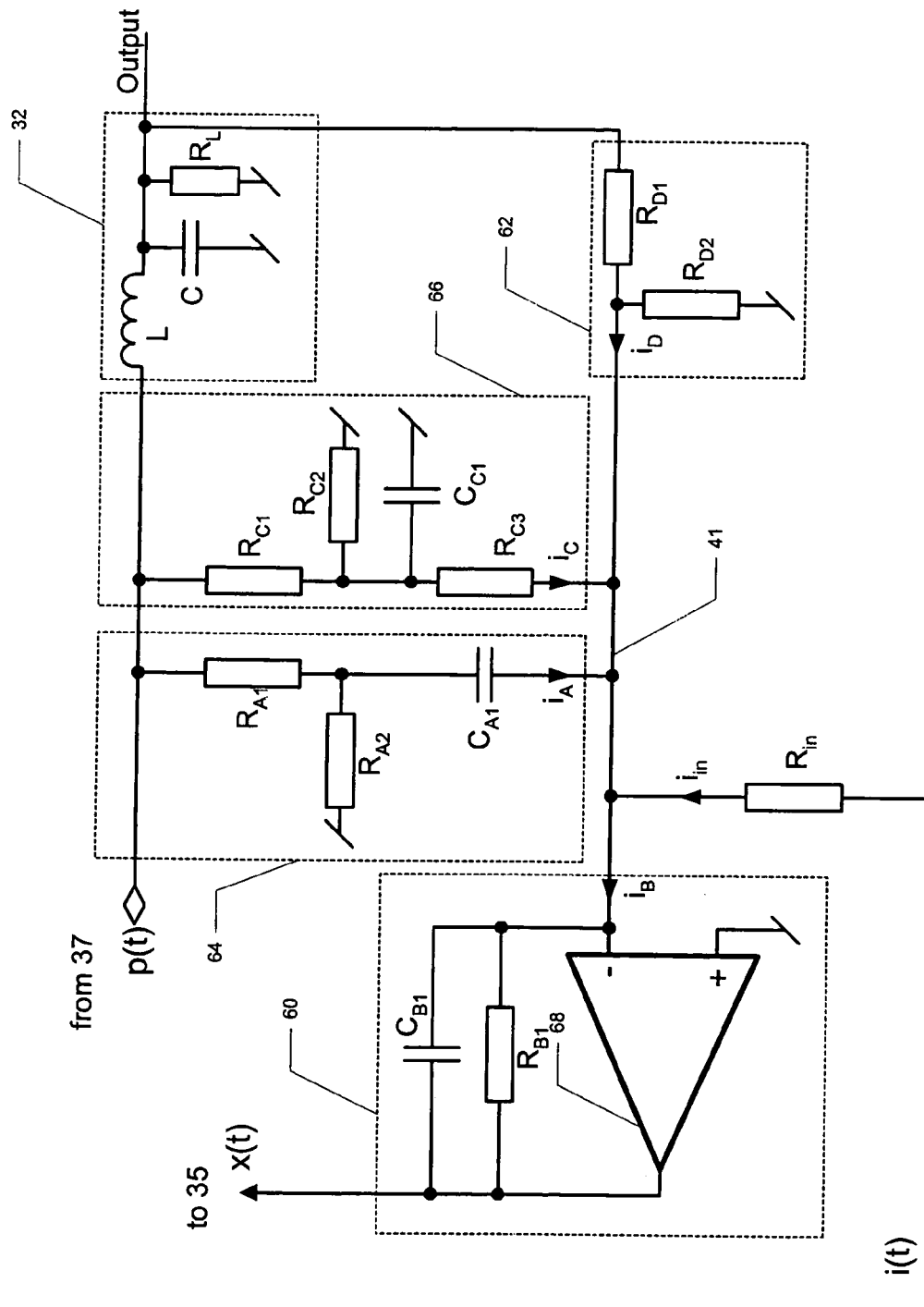
FIG. 17 is an electrical diagram, in schematic form, of an exemplary realization of the feedback loop of the audio amplifier of FIG. 16 according to the second preferred embodiment of the invention.

As shown in FIG. 17, the three feedback loops and adder 41 of amplifier 30' of FIG. 16 can be realized using operational amplifier block 60 containing a single operational amplifier 68, together with LC filter 32 itself. Output signal p(t) from power stage 37 is applied to LC filter 32, which includes a series inductor L and parallel capacitor C connected to ground, and which is also affected by load resistor $R_L$ (i.e., the impedance of the external load). The output of LC filter 32 is also fed back through resistor network 62, to generate current $i_D$ at adder node 41, which is at the virtual ground node at the inverting input of operational amplifier 68. A pair of RC networks 64, 66 connect output signal p(t) to adder node 41, generating feedback currents $i_A$, $i_C$, respectively. Input signal i(t) is applied to adder node 41 through input resistor $R_{in}$. Operational amplifier block 60 includes operational amplifier 68, which has its non-inverting input at ground and its inverting input (i.e., virtual ground input) receiving summed current $i_B$ from adder node 41, and feedback resistor $R_{B1}$ and feedback capacitor $C_{B1}$.

The total loop transfer function $H_{mae}(s)$ of the circuit of FIG. 17 is:

$$H_{mae}(s) = -\frac{X(s)}{P(s)} = [H_D(s) + H_A(s) + H_C(s)]H_B(s) \quad (27)$$

where the component transfer functions $H_A(S)$, $H_C(s)$, correspond to the transfer functions of blocks 64, 66, respectively, where the component transfer function $H_D(s)$ corresponds to the transfer function of LC filter 32 combined with resistor block 62, and where the component transfer function $H_B(S)$ corresponds to the transfer function of amplifier block 60 (and which thus multiplies the sum of the transfer functions $H_A(S)$, $H_C(s)$, $H_D(S)$ summed at adder node 41).

Those skilled in the art will be readily able to choose component values to effect the desired component transfer functions. Specifically, component transfer function $H_A(S)$ can be derived as:

$$H_A(s) = \frac{I_A(s)}{P(s)} \quad (28)$$

$$= \frac{\frac{R_{B1}}{sC_{B1}}}{R_{B1} + \frac{1}{sC_{B1}}}$$

$$= \frac{s\frac{R_{A1}R_{A2}}{R_{A1}+R_{A2}}C_{A1}}{s\frac{R_{A1}R_{A2}}{R_{A1}+R_{A2}}C_{A1} + 1} \cdot \frac{R_{A1}+R_{A2}}{R_{A1}R_{A2}}$$

$$= \frac{sC_{A1}}{s\frac{R_{A1}R_{A2}}{R_{A1}+R_{A2}}C_{A1} + 1}$$

Component transfer function $H_C(s)$ can be derived as:

$$H_C(s) = \frac{I_C(s)}{P(s)} \quad (29)$$

$$= \frac{\frac{R_{C2}}{R_{C1}+R_{C2}} \cdot \frac{1}{R_{C3} + \frac{R_{C1}R_{C2}}{R_{C1}+R_{C2}}}}{s\frac{R_{C1}R_{C2}R_{C3}}{R_{C1}+R_{C2}+R_{C3}}C_{B1} + 1}$$

$$= \frac{R_{C2}}{(R_{C1}+R_{C2})R_{C3}+R_{C1}R_{C2}} \cdot \frac{1}{s\frac{R_{C1}R_{C2}R_{C3}}{R_{C1}+R_{C2}+R_{C3}}C_{B1} + 1}$$

The combination of LC filter 32 and resistor block 62 derives component transfer function $H_D(S)$ as:

$$H_D(s) = \frac{I_D(s)}{P(s)} = \frac{1}{s^2LC + s\frac{L}{R_L} + 1} \cdot \frac{R_{D1}+R_{D2}}{R_{D1}R_{D2}} \quad (30)$$

The multiplicative transfer function $H_B(s)$ applied by amplifier block 60 is:

$$H_B(s) = \frac{X(s)}{I_B(s)} = -\frac{\frac{R_{B1}}{sC_{B1}}}{R_{B1} + \frac{1}{sC_{B1}}} = -\frac{R_{B1}}{sR_{B1}C_{B1} + 1} \quad (31)$$

It is contemplated that those skilled in the art having reference to this specification can derive the overall transfer function $H_{mae}(s)$ by substituting equations (28) through (31) into equation (27). The error transfer function $ETF_{mae}(s)$ can then be readily derived from:

$$ETF_{mae}(s) = \frac{1}{1 + K \cdot H_{mae}(s)} \quad (32)$$

where gain K is the gain of the PWM modulator of comparator 35. For the example of FIG. 17, one can derive the signal transfer function $STF_{mae}(s)$ as:

$$STF_{mae}(s) = \frac{V_{out}(s)}{V_{in}(s)} = \frac{K\frac{X(s)}{V_{in}(s)} \cdot H_{LC}(s)}{1 + K \cdot H_{mae}(s)} = \frac{K\frac{H_B(s)H_{LC}(s)}{R_{in}}}{1 + K \cdot H_{mae}(s)}$$

It is contemplated that those skilled in the art and having reference to this specification will be readily able to optimize amplifier 30', as realized according to FIG. 17 or otherwise, by selection of the various components in the feedback loop circuit. Specifically, referring to amplifier 30' illustrated in FIG. 16, the parameters that can be used in connection with the optimization are the load resistance $R_L$, the inductor and capacitor values in LC filter 32, the gains $K_a$, $K_c$, $K_d$, and the poles $p_a$, $p_b$, $p_c$. Typically, the component values for LC filter 32 are predetermined, and the load resistance $R_L$ will have upper and lower bounds. According to one exemplary implementation, the remaining six parameters (gains and poles) were optimized using a constrained numerical optimization, such as can be performed using conventional mathematics software (e.g., the MATLAB computing environment available from The MathWorks, Inc.). This exemplary optimization minimized the difference in dB between the maximum and minimum gains of the signal transfer function $STF_{mae}(s)$ at the highest frequency in the audio band of interest, for load resistance $R_L$ at its upper and lower bounds. This optimization reduced the amplitude response variation due to variations in this load resistance $R_L$. Additional constraints in the optimization can include such parameters as ripple stability (by setting a maximum transfer function amplitude at the switching frequency $F_{sw}$) closed-loop stability (by setting minimum damping factor values), and distortion (by setting an upper limit for open-loop distortion of the aliasing amplitude error function G(y)). It is contemplated that those skilled in the art having reference to this specification will be readily able to effect this optimization.

According to the preferred embodiments of the invention, therefore, important advantages can be readily attained. Primarily, a class D amplifier can be constructed in which its loop filter suppresses aliasing error in the base-band frequencies of interest. The loop filter can be very efficiently implemented, and indeed can be implemented using the output LC filter itself, which reduces the complexity and also compensates for error introduced by the LC filter, or by variations in the load impedance.

While the present invention has been described according to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. A class D amplifier circuit, comprising:
    an adder, for generating a difference signal responsive to an input signal and a feedback signal;
    a pulse-width-modulator, for comparing the difference signal to a waveform having a switching frequency, and for generating a pulse-width-modulated output signal responsive to the result of the comparing;

a power stage, for driving its output responsive to the pulse-width-modulated output signal; and a loop filter, coupled to the output of the power stage, for generating the feedback signal by applying a minimum-aliasing-error transfer function to a signal from the output of the power stage, the minimum-aliasing-error transfer function being a minimum of second order, and having a time-domain impulse response that has a time-domain impulse response h(t) having a slope that is substantially zero for small positive values of t.

2. The circuit of claim 1, wherein the loop filter comprises a plurality of feedback loop paths, each having a component transfer function.

3. The circuit of claim 2, wherein the component transfer function of at least one of the plurality of feedback loop paths is of at least second-order.

4. The circuit of claim 2, further comprising:
an LC filter, coupled to the output of the power stage, the LC filter having a transfer function, and having an output;
wherein at least one of the plurality of feedback loop paths is coupled to the output of the power stage;
and wherein at least one of the plurality of feedback loop paths is coupled to the output of the LC filter.

5. The circuit of claim 4, wherein the at least one of the plurality of feedback loop paths coupled to the output of the power stage has a component transfer function of first order.

6. The circuit of claim 4, wherein the transfer function of the LC filter is of at least second order.

7. The circuit of claim 1, wherein the minimum-aliasing-error transfer function is at least third order.

8. The circuit of claim 1, wherein the minimum-aliasing-error transfer function has a magnitude characteristic versus frequency that has a most negative slope for frequencies below the switching frequency that is flatter than the most negative slope of the real part of the minimum-aliasing-error transfer function at frequencies above the switching frequency.

9. The circuit of claim 8, wherein the most negative slope of the magnitude characteristic versus frequency for frequencies below the switching frequency is about 40 dB/decade;
and wherein the most negative slope of the real part of the minimum-aliasing-error transfer function at frequencies above the switching frequency is about 80 dB/decade.

10. A class D amplifier circuit, comprising:
an adder, for generating a difference signal responsive to an input signal and a feedback signal;
a pulse-width-modulator, for comparing the difference signal to a waveform having a switching frequency, and for generating a pulse-width-modulated output signal responsive to the result of the comparing;
a power stage, for driving its output responsive to the pulse-width-modulated output signal; and
a loop filter, coupled to the output of the power stage, for generating the feedback signal by applying a minimum-aliasing-error transfer function to a signal from the output of the power stage, the minimum-aliasing-error transfer function being a minimum of second order, and having a magnitude characteristic versus frequency that has a most negative slope for frequencies below the switching frequency that is flatter than the most negative slope of the real part of the minimum-aliasing-error transfer function at frequencies above the switching frequency.

11. The circuit of claim 10, wherein the loop filter comprises a plurality of feedback loop paths, each having a component transfer function.

12. The circuit of claim 11, wherein the component transfer function of at least one of the plurality of feedback loop paths is of at least second-order.

13. The circuit of claim 11, further comprising:
an LC filter, coupled to the output of the power stage, the LC filter having a transfer function, and having an output;
wherein at least one of the plurality of feedback loop paths is coupled to the output of the power stage;
and wherein at least one of the plurality of feedback loop paths is coupled to the output of the LC filter.

14. The circuit of claim 13, wherein the at least one of the plurality of feedback loop paths coupled to the output of the power stage has a component transfer function of first order.

15. The circuit of claim 13, wherein the transfer function of the LC filter is of at least second order.

16. The circuit of claim 10, wherein the most negative slope of the magnitude characteristic versus frequency for frequencies below the switching frequency is about 40 dB/decade;
and wherein the most negative slope of the real part of the minimum-aliasing-error transfer function at frequencies above the switching frequency is about 80 dB/decade.

17. The circuit of claim 10, wherein the minimum-aliasing-error transfer function is at least third order.

18. The circuit of claim 10, wherein the loop filter has a time-domain impulse response h(t) having a slope that is substantially zero for small positive values of t.

19. A class D amplifier circuit, comprising:
a pulse-width-modulator, for comparing a difference signal to a waveform having a switching frequency, and for generating a pulse-width-modulated output signal responsive to the result of the comparing;
a power stage, for driving its output responsive to the pulse-width-modulated output signal;
an LC filter, coupled to the output of the power stage, the LC filter having a transfer function, and having an output; and
a loop filter, comprising:
at least a first feedback loop path, coupled to the output of the power stage and producing a first feedback signal, and having a first order transfer function;
a second feedback loop path and producing a second feedback signal, coupled to the output of the LC filter; and
a multiplicative filter function, for applying a transfer function of at least first order to a sum including the first and second feedback signals and an input signal, to produce the difference signal.

20. The circuit of claim 19, wherein the loop filter further comprises:
a third feedback loop path, coupled to the output of the power stage and producing a third feedback signal, and having a first order transfer function.
wherein the multiplicative filter function applies its transfer function to a sum including the first, second, and third feedback signals and an input signal.

21. The circuit of claim 20, wherein the loop filter further comprises:
first, second, and third gain stages, for applying first, second, and third gain values, respectively, in generating the first, second, and third feedback signals.

22. The circuit of claim 20, wherein the multiplicative filter function comprises:

an operational amplifier, having an input coupled to an adder node, and having an output coupled to the pulse-width-modulator to present the difference signal;

wherein the first feedback loop path comprises a first R-C network connected between the output of the power stage and the adder node;

wherein the third feedback loop path comprises a second first R-C network connected between the output of the power stage and the adder node;

wherein the second feedback loop path comprises a resistor network connected between the output of the LC filter and the adder node;

and wherein the adder node also receives the input signal.

23. The circuit of claim 19, wherein the loop filter has a transfer function that has a magnitude characteristic versus frequency that has a most negative slope for frequencies below the switching frequency that is flatter than the most negative slope of the real part of the minimum-aliasing-error transfer function at frequencies above the switching frequency.

24. The circuit of claim 23, wherein the most negative slope of the magnitude characteristic versus frequency for frequencies below the switching frequency is about 40 dB/decade;

and wherein the most negative slope of the real part of the minimum-aliasing-error transfer function at frequencies above the switching frequency is about 80 dB/decade.

* * * * *